United States Patent
Sakamaki

(10) Patent No.: US 9,371,679 B2
(45) Date of Patent: Jun. 21, 2016

(54) STRUCTURE FOR FIXING FOREIGN OBJECT DETECTION SENSOR AND FOREIGN OBJECT DETECTION APPARATUS HAVING THE STRUCTURE

(75) Inventor: Ryousuke Sakamaki, Toyohashi (JP)

(73) Assignee: ASMO CO., LTD., Kosai-shi (JP)

( * ) Notice: Subject to any disclaimer, the term of this patent is extended or adjusted under 35 U.S.C. 154(b) by 871 days.

(21) Appl. No.: 13/533,503

(22) Filed: Jun. 26, 2012

(65) Prior Publication Data

US 2013/0001388 A1  Jan. 3, 2013

(30) Foreign Application Priority Data

Jun. 30, 2011 (JP) ................................. 2011-146462
Jun. 30, 2011 (JP) ................................. 2011-146463

(51) Int. Cl.
*E05F 15/02* (2006.01)
*E05F 15/44* (2015.01)
*H03K 17/955* (2006.01)
*H01H 3/14* (2006.01)

(52) U.S. Cl.
CPC ............. *E05F 15/44* (2015.01); *E05Y 2900/50* (2013.01); *H01H 3/142* (2013.01); *H03K 17/955* (2013.01)

(58) Field of Classification Search
CPC ...... E05F 15/44; H03K 17/955; H01H 3/142; E05Y 2900/50
USPC .................. 49/27, 490.1, 495.1; 248/222.11, 248/222.12, 71
See application file for complete search history.

(56) References Cited

U.S. PATENT DOCUMENTS

| 4,441,301 | A | * | 4/1984 | Benson ..................... 52/784.13 |
| 5,259,143 | A | * | 11/1993 | Mitchell et al. ................... 49/27 |
| 6,339,305 | B1 | * | 1/2002 | Ishihara et al. ............... 318/445 |
| 2002/0104373 | A1 | | 8/2002 | Ishihara et al. |
| 2004/0107640 | A1 | | 6/2004 | Ishihara et al. |
| 2005/0117270 | A1 | * | 6/2005 | Scherraus ..................... 361/302 |
| 2008/0180114 | A1 | | 7/2008 | Fujiwara et al. |
| 2009/0100755 | A1 | | 4/2009 | Ishihara |
| 2012/0235437 | A1 | * | 9/2012 | Sakamaki et al. ........... 296/1.08 |

FOREIGN PATENT DOCUMENTS

| CN | 101142369 A | 3/2008 |
| CN | 101236258 A | 8/2008 |
| JP | 61-226678 A | 10/1986 |

(Continued)

OTHER PUBLICATIONS

Chinese Office Action of CN 201210235568.2 dated Oct. 19, 2015 with its English Translation.

*Primary Examiner* — Gwendolyn Baxter
(74) *Attorney, Agent, or Firm* — Christensen Fonder P.A.

(57) ABSTRACT

In a structure for fixing a foreign object detection sensor, a foreign object detection sensor, which detects a foreign object by being elastically deformed by external force applied by the foreign object detection, is fixed to a plastic bracket. A support portion projects from the outer peripheral surface of the foreign object detection sensor. The bracket has a penetration portion through which the support portion is passed. The foreign object detection sensor and the support portion inserted through the penetration portion clamp the bracket from opposite sides of the extending direction of the penetration portion.

14 Claims, 12 Drawing Sheets

(56) References Cited

FOREIGN PATENT DOCUMENTS

| JP | 11-271154 A | 10/1999 |
|----|-------------|---------|
| JP | 2002-235480 A | 8/2002 |
| JP | 2002-242535 * | 8/2002 |
| JP | 2004-124465 A | 4/2004 |
| JP | 2005-022609 A | 1/2005 |
| JP | 2006-118200 A | 5/2006 |
| JP | 2010-001715 A | 1/2010 |
| JP | 2011-057188 A | 3/2011 |

* cited by examiner

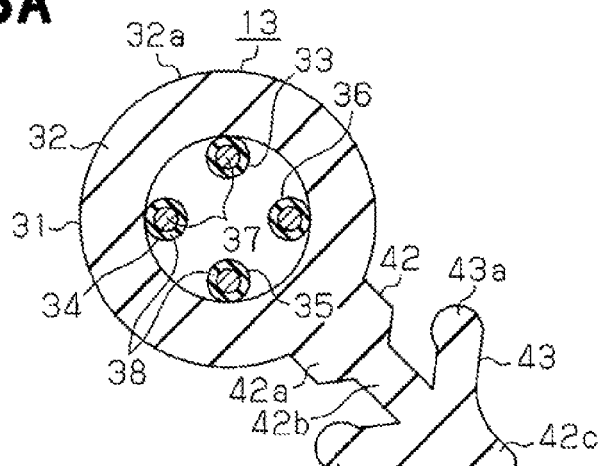
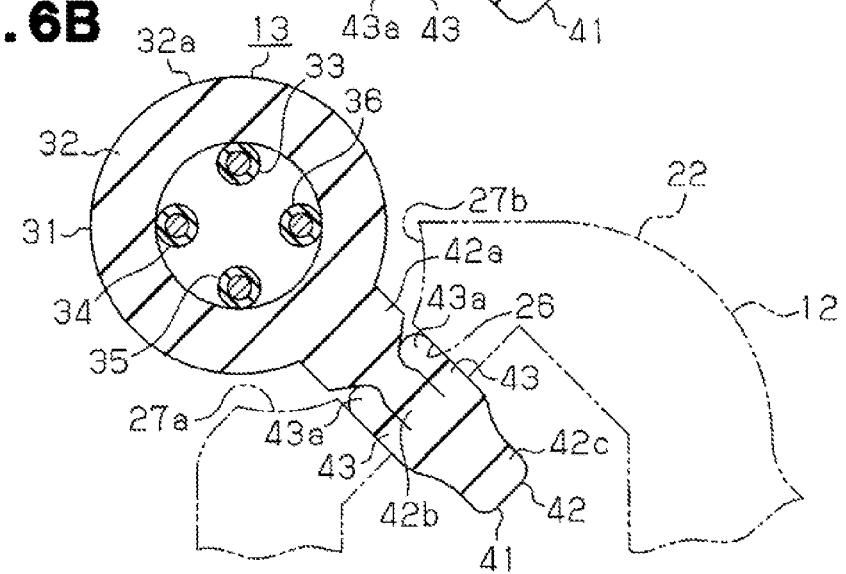
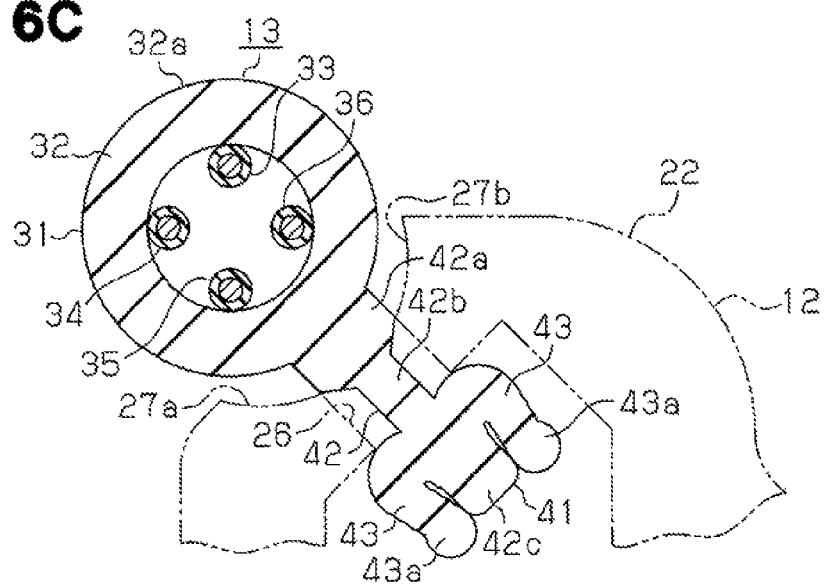

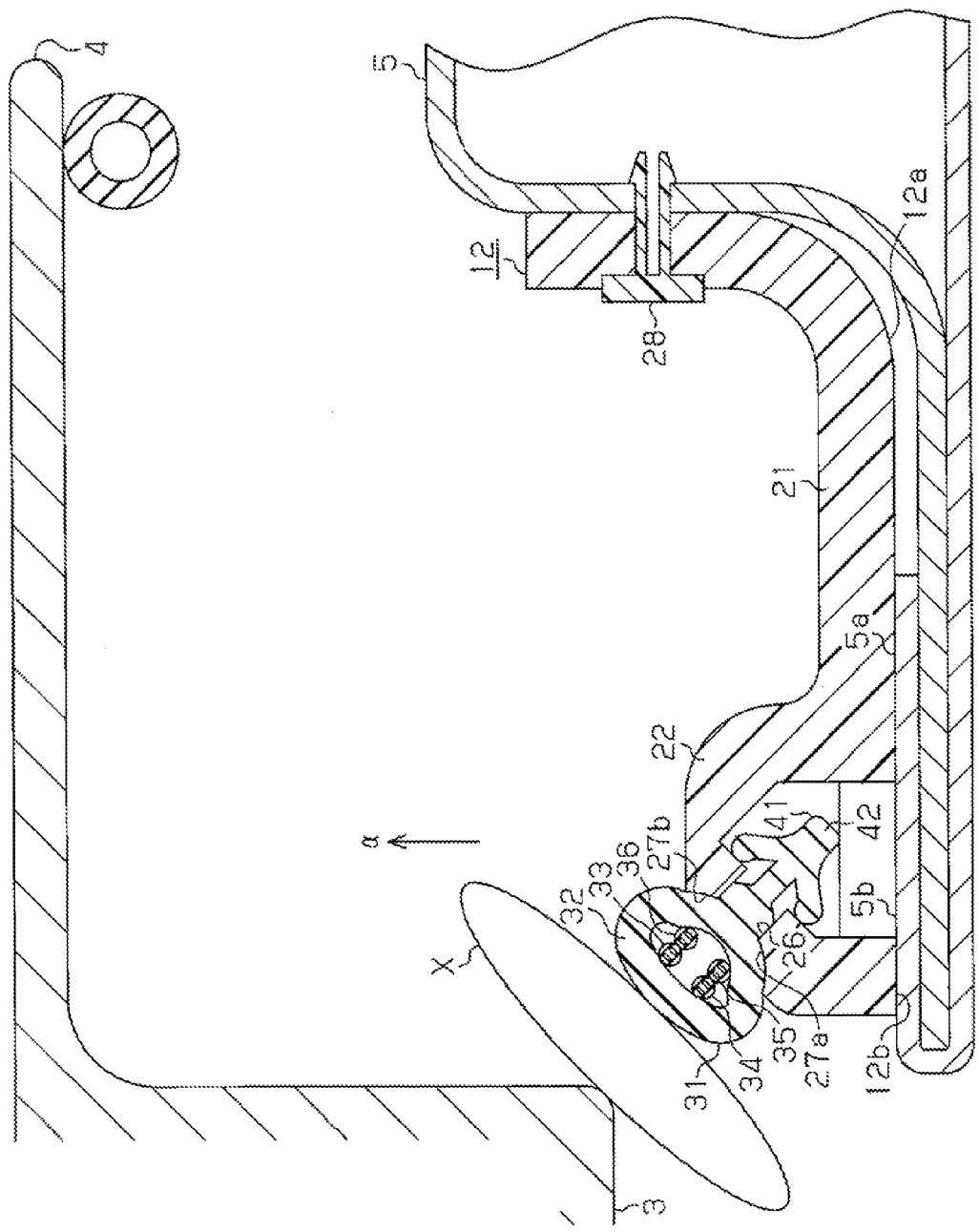

STRUCTURE FOR FIXING FOREIGN OBJECT DETECTION SENSOR AND FOREIGN OBJECT DETECTION APPARATUS HAVING THE STRUCTURE

BACKGROUND OF THE INVENTION

The present invention relates to a structure for fixing a foreign object detection sensor to a bracket and a foreign object detection apparatus having the structure.

Conventionally, a foreign object detection apparatus may be employed in an electric door opening/closing apparatus, which selectively opens and closes an opening formed in the body of a vehicle, such as an entrance or a tail opening of the vehicle, by moving a door panel electrically using drive force produced by a motor. The foreign object detection apparatus detects a foreign object between a peripheral portion of the opening and the door panel, thus preventing the foreign object from being caught between the peripheral portion of the opening and the door panel. For example, in a foreign object detection apparatus described in Japanese Laid-Open Patent Publication No. 2002-242535, a foreign object sensor, which detects a foreign object by being elastically deformed by external force applied by the foreign object detection, is fixed to a metal bracket attached to a peripheral portion of a door panel.

To reduce the weight of a vehicle having a foreign object detection apparatus, it is preferable to employ a plastic bracket, instead of a metal bracket. In a conventional structure for fixing a foreign object detection sensor to a plastic bracket, the sensor is adhered to the bracket using a double-faced adhesive tape, for example, and thus fixed to the bracket.

However, it is difficult to maintain the foreign object detection sensor in a stably fixed state when the sensor is adhered to the bracket with the double-faced adhesive tape.

SUMMARY OF THE INVENTION

Accordingly, it is an objective of the present invention to provide a fixing structure for a foreign object detection sensor that stably fixes the sensor to a plastic bracket and a foreign object detection apparatus having the fixing structure.

To achieve the foregoing objective and in accordance with one aspect of the present invention, a structure for fixing a foreign object detection sensor to a plastic bracket is provided. The foreign object detection sensor is adapted for detecting a foreign object by being elastically deformed by external force applied by the foreign object. A support portion projects from an outer peripheral surface of the foreign object detection sensor. The bracket has a penetration portion, through which the support portion is passed. The foreign object detection sensor and the support portion inserted through the penetration portion clamp the bracket from opposite sides of the extending direction of the penetration portion.

In accordance with another aspect of the present invention, a structure for fixing an elongated foreign object detection sensor to a plastic bracket attached to an attachment surface is provided. The foreign object detection sensor is elastically deformed by external force applied by a foreign object to detect the foreign object. The attachment surface is provided on a peripheral portion of an opening formed in a vehicle body or on a peripheral portion of an opening/closing body for selectively opening and closing the opening that is opposed to the edge portion of the opening. The foreign object detection sensor is fixed to the bracket by inserting a support portion projecting from an outer peripheral surface of the foreign object detection sensor into the bracket such that the support portion becomes inclined with respect to the attachment surface as viewed in a cross section perpendicular to a longitudinal direction of the foreign object detection sensor.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 6A, 6B, and 6C are cross-sectional views each showing the sensor line;

FIG. 11 is a cross-sectional view taken along line 11-11 of FIG. 9, showing the vicinity of a tail opening of the vehicle;

DETAILED DESCRIPTION OF THE PREFERRED EMBODIMENTS

A first embodiment of the present invention will now be described with reference to the attached drawings.

Figure 1:
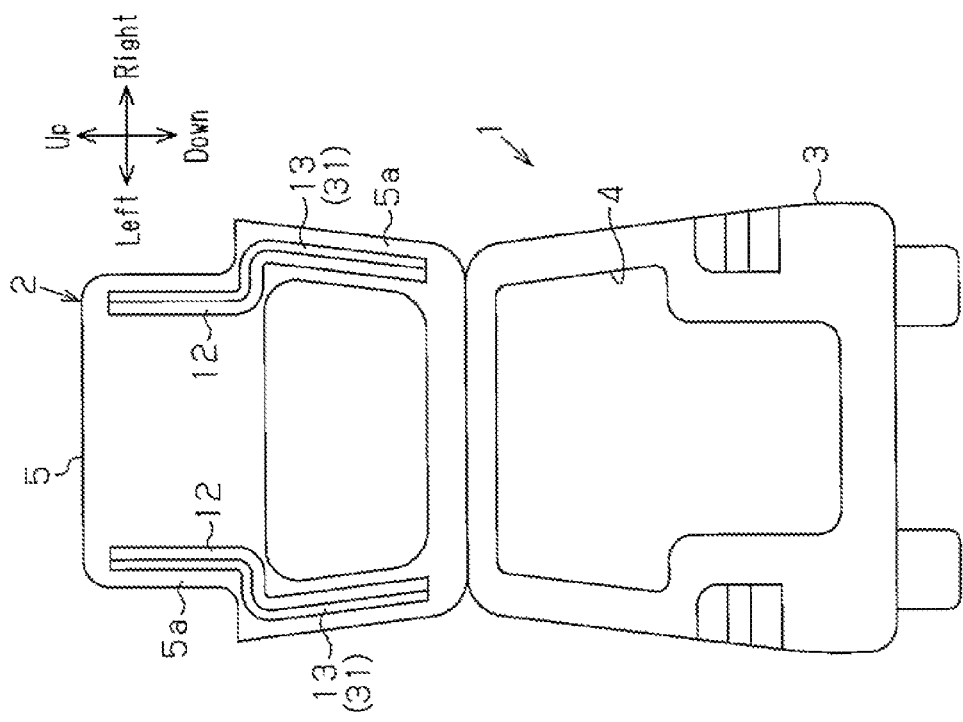
FIG. 1 is a diagram schematically showing a vehicle having an electric tail door apparatus.

As shown in FIG. 1, a vehicle 1 has an electric tail door apparatus 2. The vehicle 1 includes a vehicle body 3 formed of conductive metal. A tail opening 4 is formed in a tail portion of the vehicle body 3. The lateral dimension (the width) of the portion of the tail opening 4 that is below substantially the middle portion of the tail opening 4 in the vertical direction is less than the lateral dimension of the portion of the tail opening 4 that is above substantially the middle portion. The tail opening 4 is selectively opened and closed by a door panel 5, which is formed of conductive metal and has a shape corresponding to the shape of the tail opening 4.

The lateral dimension of the portion of the door panel 5 below substantially the middle portion of the door panel 5 in the vertical direction (approximately the upper half of the door panel 5 as viewed in FIG. 1) is smaller than the lateral dimension of the portion of the door panel 5 above substantially the middle portion (approximately the lower half as viewed in the drawing). As a result, the opposite lateral ends of the door panel 5 are non-linear. The upper end of the door panel 5 is rotationally joined to the upper end of a tail surface of the vehicle body 3. The door panel 5 rotates about the joint portion between the door panel 5 and the vehicle body 3 such that the lower end of the door panel 5 moves in the vertical direction. The door panel 5 is switchable between a fully closed position and a fully open position. When at the fully closed position, the door panel 5 fully closes the tail opening 4. When the door panel 5 is at the fully open position, the tail opening 4 is maximally open.

Figure 2:
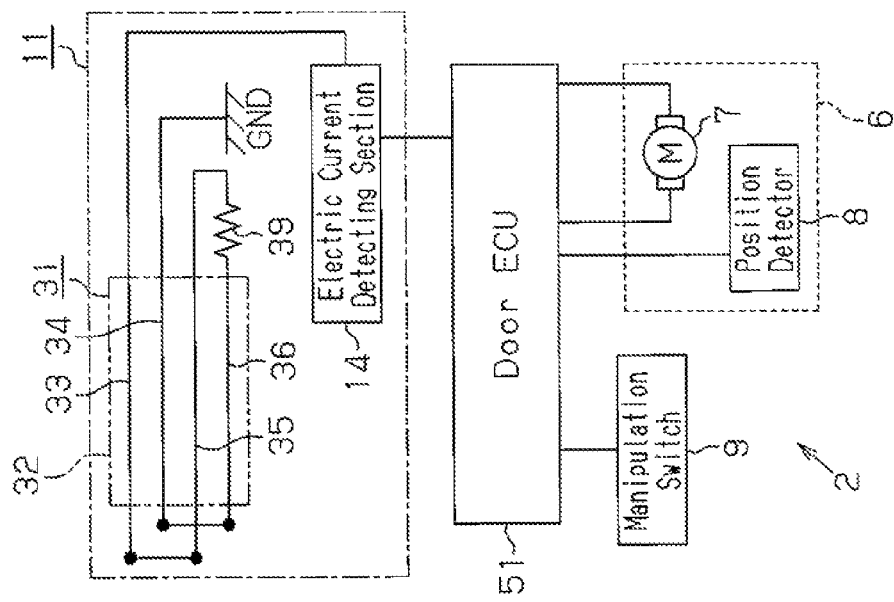
FIG. 2 is a block diagram representing the electric configuration of the electric tail door apparatus illustrated in FIG. 1.

With reference to FIG. 2, a drive mechanism (not shown) having an actuator 6 is mounted in the vehicle body 3 and connected to the door panel 5. In the electric tail door apparatus 2, the actuator 6 is actuated to rotate the door panel 5 in the vertical direction to selectively open and close the tail opening 4.

The actuator 6 has a motor 7 and a speed reducing mechanism (not shown), which outputs rotation of the motor 7 after reducing the speed. A position detector 8 for detecting rotation of the motor 7 is mounted in the actuator 6. The position detector 8 is configured by, for example, a permanent magnet and a Hall IC (not shown). The permanent magnet rotates integrally with a rotary shaft (not shown) of the motor 7 or a speed reducing gear (not shown), which is a component of the speed reducing mechanism. The Hall IC opposes the permanent magnet. The Hall IC generates a pulse signal in correspondence with a change in the magnetic field of the permanent magnet caused by rotation of the permanent magnet as a position detection signal.

The electric tail door apparatus 2 includes a manipulation switch 9 for commanding selective opening/closing of the door panel 5. Referring to FIGS. 1 and 2, when the manipulation switch 9 is manipulated by an occupant of the vehicle 1 to open the tail opening 4, the manipulation switch 9 outputs an opening signal to rotate the door panel 5 to open the tail opening 4. In contrast, when manipulated to close the tail opening 4, the manipulation switch 9 outputs a closing signal to rotate the door panel 5 to close the tail opening 4. The manipulation switch 9 may be arranged at a predetermined position in the passenger compartment such as a position on a dashboard or a door lever (not shown) for the door panel 5 or a portable object (not shown) carried together with an ignition key.

Figure 3:
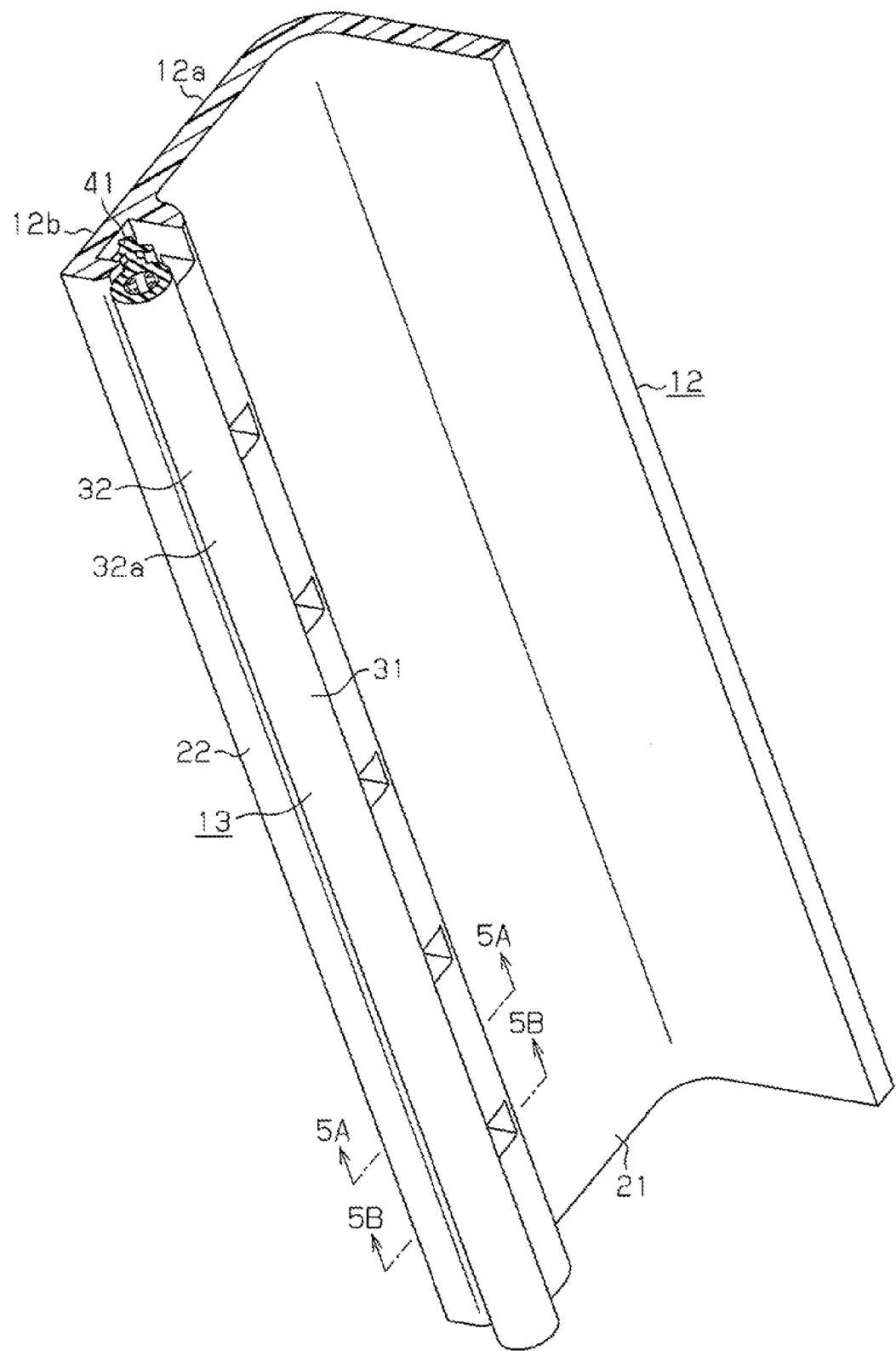
FIG. 3 is a perspective view showing the bracket illustrated in FIG. 1 and a sensor line fixed to the bracket.
Figure 8:
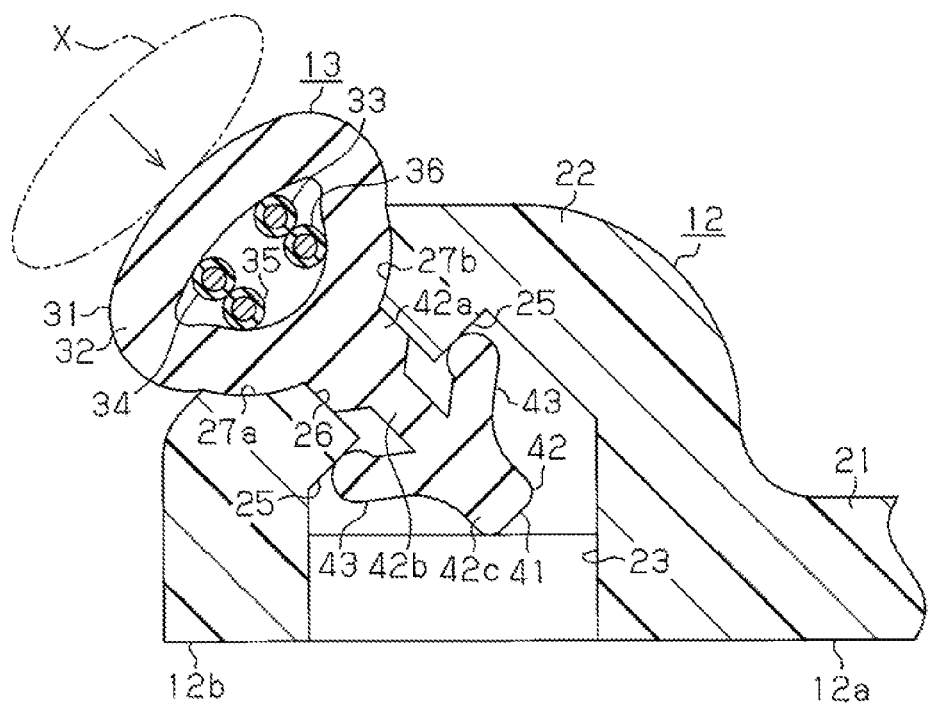
FIG. 8 is a cross-sectional view showing the bracket and the sensor line of FIG. 3 at the time when a foreign object contacts a foreign object detection sensor.

The electric tail door apparatus 2 includes a foreign object detection apparatus 11, which detects a foreign object X (see FIG. 8) between a peripheral portion of the door panel 5 and an opposed peripheral portion of the tail opening 4. As shown in FIGS. 1 to 3, the foreign object detection apparatus 11 has a pair of brackets 12 attached to peripheral portions of the door panel 5, elongated sensor lines 13 fixed to the corresponding brackets 12, and an electric current detecting section 14, which is electrically connected to the sensor lines 13.

With reference to FIG. 1, the brackets 12 are attached to peripheral portions of the door panel 5 facing the corresponding peripheral portions of the tail opening 4. Specifically, the brackets 12 are mounted at the opposite lateral ends of the inner surface of the door panel 5, which is the side surface of the door panel 5 facing the passenger compartment. Each of the brackets 12 has a substantially elongated shape that extends from the upper end to the lower end of the door panel 5 along the corresponding one of the lateral ends of the door panel 5. Each bracket 12 has an angled middle portion in the longitudinal direction of the bracket 12, or, in other words, the vertical direction of the door panel 5, in correspondence with the non-linear shape of the corresponding lateral end of the door panel 5.

Figure 4:
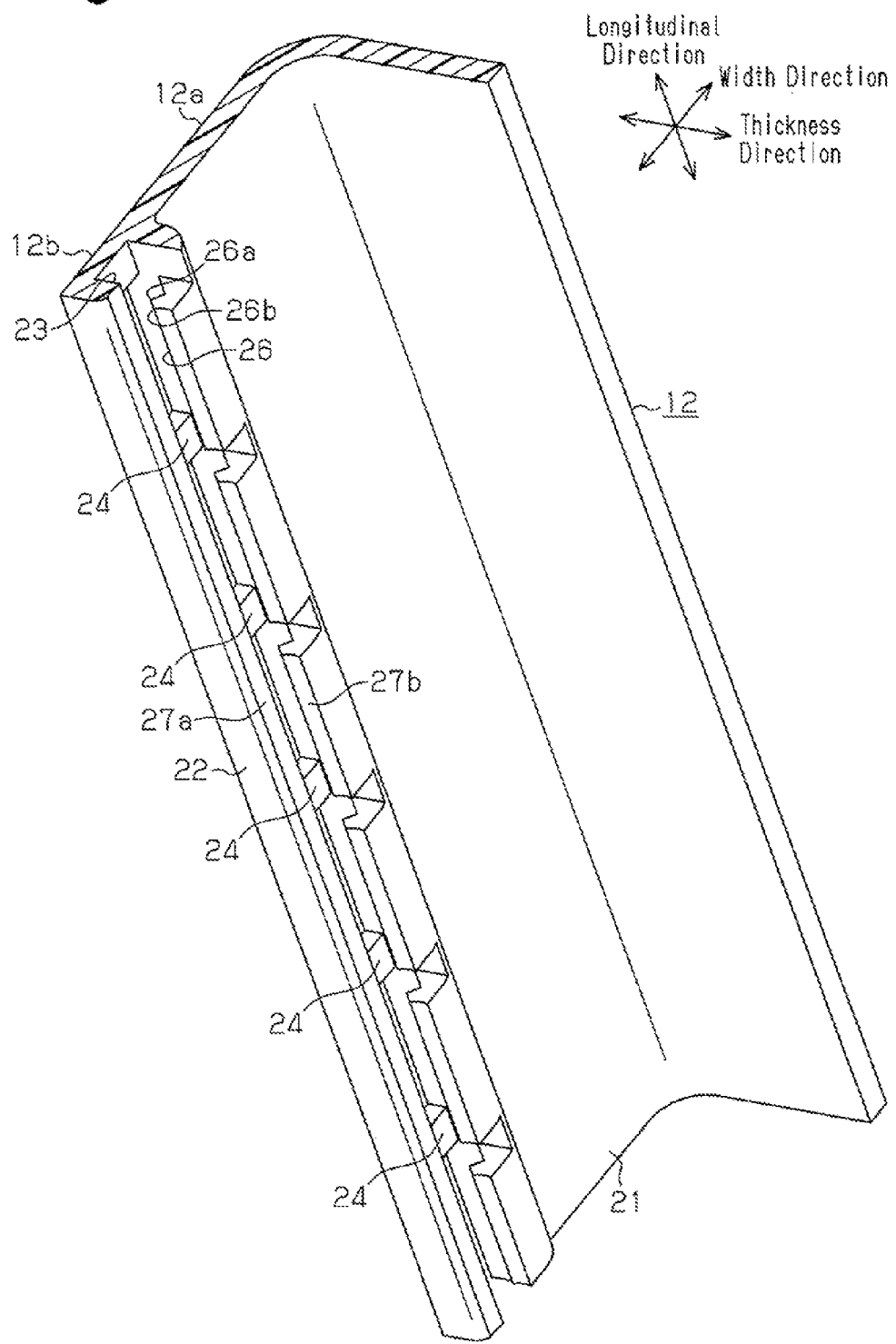
FIG. 4 is a perspective view showing the bracket of FIG. 3.

As shown in FIG. 4, each of the brackets 12 includes a fixing portion 21 extending in the longitudinal direction of the bracket 12 and a holding portion 22, which is formed integrally with the fixing portion 21 at an end of the fixing portion 21 in the width direction of the fixing portion 21.

Each of the fixing portions 21 has a shape corresponding to the shape of the surface of the portion in the door panel 5 to which the corresponding one of the brackets 12 is attached. In the first embodiment, each fixing portion 21 has a substantially L-shaped plate-like cross section perpendicular to the longitudinal direction of the fixing portion 21. One side surface of each bracket 12 in the thickness direction, which is a direction perpendicular to the longitudinal direction and the width direction, is a contact surface 12a. The contact surface 12a contacts an attachment surface 5a (see FIG. 1) of the door panel 5 when the bracket 12 is attached to the door panel 5. In the first embodiment, the contact surface 12a corresponds to the outer surface of the L shape of each bracket 12, which has the L-shaped cross section. As illustrated in FIG. 1, the attachment surfaces 5a are located at the lateral ends of the inner surface of the door panel 5, which faces the passenger compartment.

With reference to FIGS. 1 and 4, each holding portion 22 is formed along the corresponding one of the opposite ends of the fixing portion 21 in the width direction, which is to be located close to the outer periphery of the door panel 5 compared to the other opposite end when the bracket 12 is attached to the door panel 5. The holding portion 22 extends continuously from one longitudinal end to the other of the fixing portion 21. The holding portion 22 has a semi-cylindrical shape extending in the longitudinal direction of the fixing portion 21. The thickness of each holding portion 22 is greater than the thickness of each fixing portion 21. The holding portion 22 projects to the opposite side to the contact surface 12a.

Figure 5A:
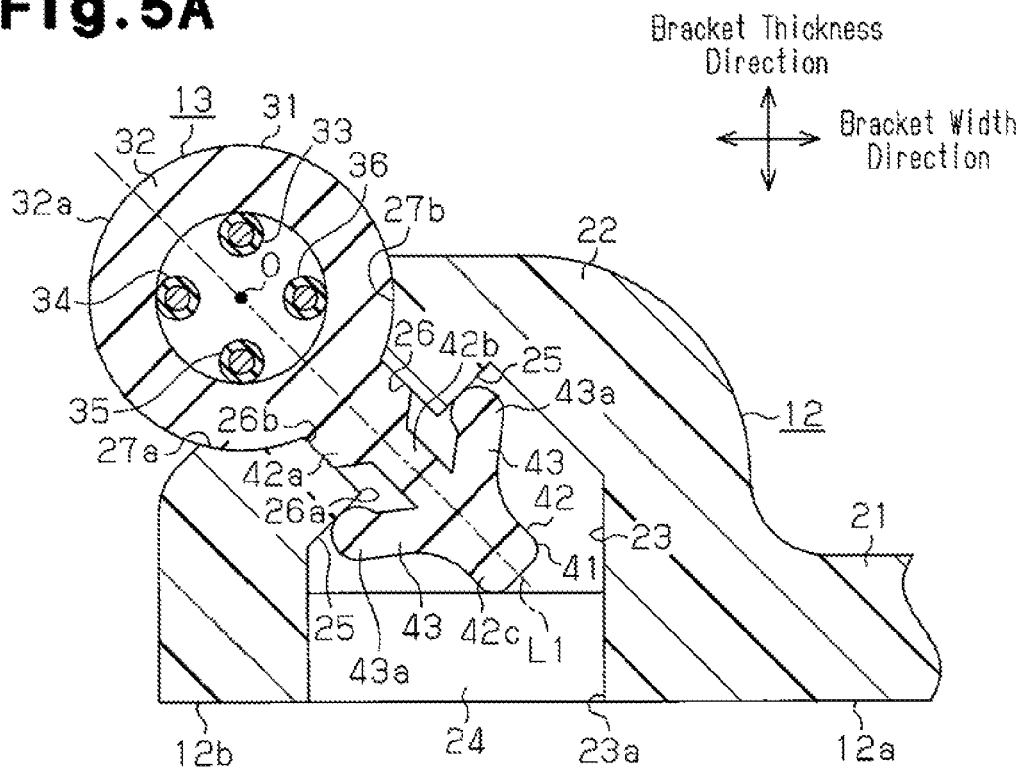
FIG. 5A is a cross-sectional view taken along line 5A-5A, showing the bracket and the sensor line of FIG. 3.
Figure 5B:
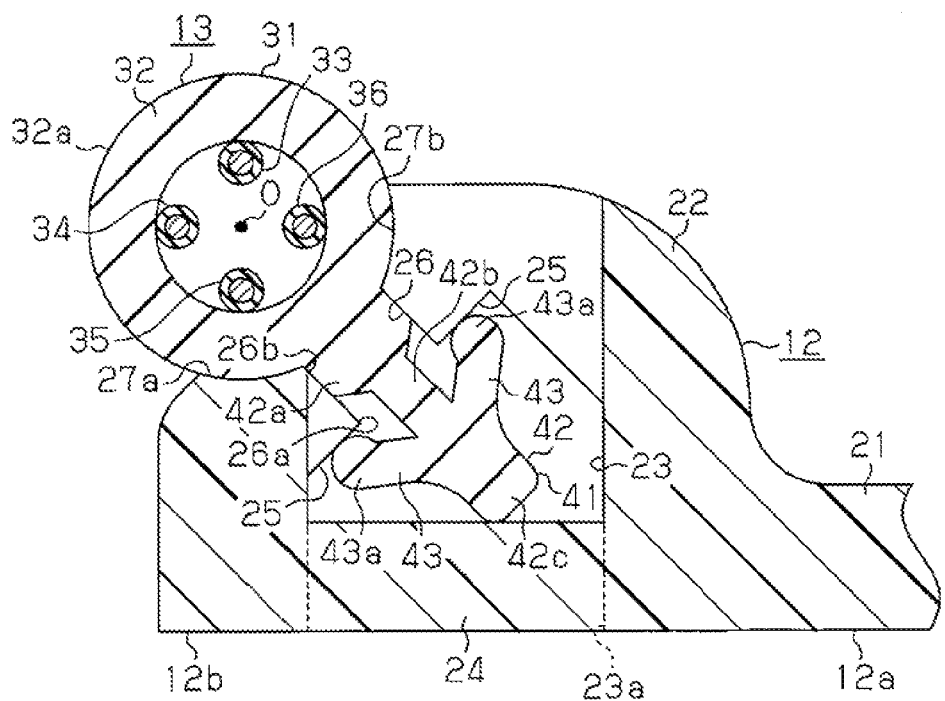
FIG. 5B is a cross-sectional view taken along line 5B-5B, showing the bracket and the sensor line of FIG. 3.

As illustrated in FIG. 5A, each holding portion 22 includes a holding recess 23, which is dented from the side corresponding to the contact surface 12a and has an opening 23a in the contact surface 12a. The opening 23a of the holding recess 23 is formed in a holding-side contact surface 12b, which is the portion of the contact surface 12a corresponding to the holding portion 22. The holding recess 23 extends continuously in the longitudinal direction of the bracket 12. Referring to FIGS. 4 and 5B, a plurality of bridge portions 24, which cross the opening 23a of the holding recess 23 in the width direction of the bracket 12, are formed in the opening 23a of the holding recess 23 at a plurality of positions in the longitudinal direction of the bracket 12. Each of the bridge portions 24 connects two opposed inner wall surfaces of the holding recess 23 in the width direction of the bracket 12.

With reference to FIG. 5A, flat pressing surfaces 25, each of which is inclined with respect to the holding-side contact surface 12b, is formed on the bottom surface of the holding recess 23. Each pressing surface 25 extends from one longitudinal end to the other in the bracket 12. The pressing surface 25 is inclined with respect to the holding-side contact surface 12b such that the pressing surface 25 becomes closer to the holding-side contact surface 12b as the distance from the fixing portion 21 in the width direction of the bracket 12 increases.

A through hole 26, which serves as a penetration portion that extends through the bottom of the holding recess 23, is formed in each holding portion 22. The through hole 26 extends through the bottom of the holding recess 23 in the holding portion 22 in a direction perpendicular to the pressing surfaces 25. As a result, the through hole 26 is inclined with respect to the holding-side contact surface 12b such that the distance between the through hole 26 and the holding-side contact surface 12b becomes greater as the through hole 26 becomes more separated from the fixing portion 21 in the width direction of the bracket 12. An inner opening 26a of the through hole 26 is formed in a middle portion between the pressing surfaces 25 in the width direction of the bracket 12. As illustrated in FIG. 4, the through hole 26 extends from one longitudinal end to the other of the bracket 12 in the longitudinal direction of the bracket 12. The through hole 26 is formed in a slit-like shape.

The holding portion 22 includes a pair of receiving surfaces 27a, 27b, which are formed at the opposite sides of an outer opening 26b of the through hole 26 in the width direction. Referring to FIG. 5A, each of the receiving surfaces 27a, 27b is a round surface having an arcuate shape dented toward the holding-side contact surface 12b as viewed in a cross section perpendicular to the longitudinal direction of the bracket 12. The two receiving surfaces 27a, 27b extend along the longitudinal hole 26 in the longitudinal direction of the bracket 12 at the opposite sides of the outer opening 26b of the through hole 26 in the width direction. Each of the receiving surfaces 27a, 27b extends from one longitudinal end to the other in the bracket 12. The radius of curvature of the receiving surface 27a is equal to that of the receiving surface 27b. The center of curvature O of the receiving surface 27a coincides with the center of curvature O of the receiving surface 27b. The center of curvature O of the receiving surfaces 27a, 27b is located on the axis L1 of the through hole 26, which includes the center of the through hole 26 in the width direction and extends in the extending direction of the through hole 26, as viewed along the cross section perpendicular to the longitudinal direction of the bracket 12.

With reference to FIGS. 1 and 4, the brackets 12 are arranged at the opposite lateral ends of the inner surface of the door panel 5 such that the contact surfaces 12a contact the corresponding attachment surfaces 5a, that the holding portions 22 are each located at the side corresponding to the outer periphery of the door panel 5, and that the fixing portions 21 are each arranged at the side closer to the lateral middle of the door panel 5. The holding-side contact surface 12b of each bracket 12 contacts a portion of the corresponding attachment surface 5a that extends substantially perpendicular to the direction in which the door panel 5 moves in closing operation. Each bracket 12 is attached to the door panel 5 using pins (not shown) extending through the fixing portion 21 at a plurality of positions.

As illustrated in FIG. 3, the sensor line 13 has a string-like shape. The sensor line 13 includes a foreign object detection sensor 31 and a support portion 41, through which the foreign object detection sensor 31 is fixed to the bracket 12.

An elongated hollow insulating body 32, which is a component of each of the foreign object detection sensors 31, is formed by an elastically deformable insulating body having an insulating property and a shape restoring property. Each of the insulating bodies may be formed of soft plastic or rubber including elastomer. Each hollow insulating body 32 is formed substantially in a cylindrical shape. An outer peripheral surface 32a of the hollow insulating body 32, which is the outer peripheral surface of the foreign object detection sensor 31, has a cylindrical shape. As illustrated in FIG. 5A, the radius of curvature of each receiving surface 27a, 27b is equal to the radius of curvature of the outer peripheral surface 32a of the hollow insulating body 32.

Figure 7:
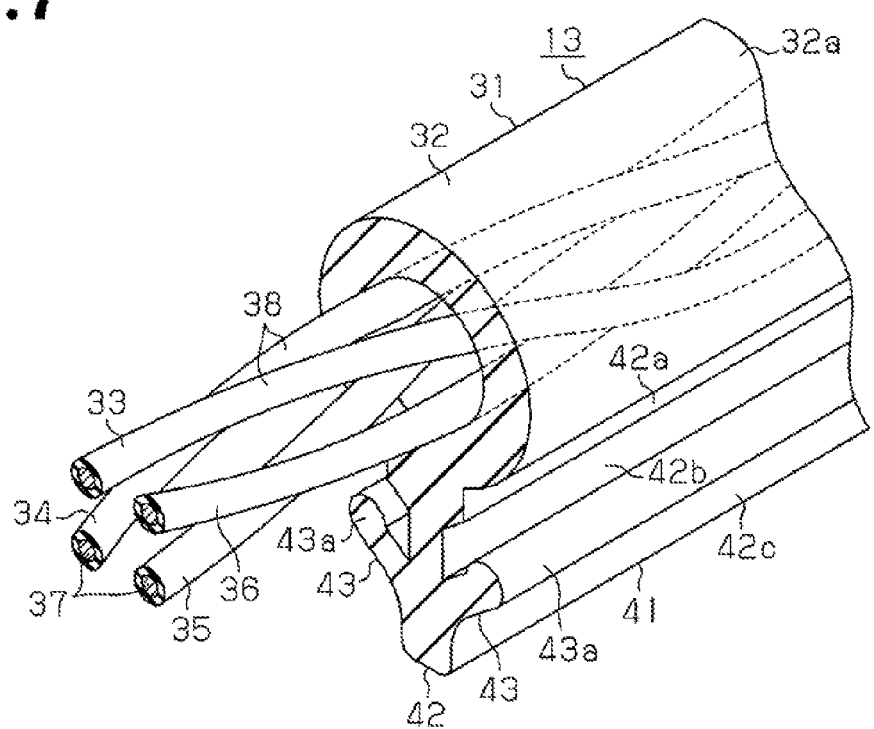
FIG. 7 is a perspective view showing the sensor line illustrated in FIG. 3.

As shown in FIGS. 6A and 7, four electrode wires 33, 34, 35, 36 are arranged in each hollow insulating body 32. Each of the electrode wires 33 to 36 is configured by a flexible core electrode 37 and a cylindrical conductive coating layer 38. The core electrode wire 33 is formed by twisting fine conductive wires. The conductive coating layer 38 is conductive and elastic and coats the outer periphery of the core electrode 37. The electrode wires 33 to 36 are circumferentially spaced apart at regular angular intervals (in the first embodiment, at 90°) in the hollow conductive insulating body 32. Each of the electrode wires 33 to 36 extends helically in the longitudinal direction of the hollow insulating body 32 with the interval between each adjacent circumferential pair of the electrode wires 33 to 36 maintained uniform. A portion of each electrode wire 33 to 36 is slightly embedded in the hollow insulating body 32 at the inner side of the hollow insulating body 32. The hollow insulating body 32 thus holds the electrode wires 33 to 36.

As illustrated in FIG. 2, first longitudinal ends (left ends as viewed in FIG. 2) of the electrode wires 33, 35 are joined together to electrically connect the electrode wires 33, 35 to each other. Similarly, first longitudinal ends (left ends as viewed in the drawing) of the electrode wires 34, 36 are joined together to electrically connect the electrode wires 34, 36 to each other. Second longitudinal ends of the electrode wires 35, 36 are electrically connected to each other through a resistor 39. A second longitudinal end of the electrode wire 33 is electrically connected to the electric current detecting section 14. A second longitudinal end of the electrode wire 34 is connected to a ground GND. In other words, the second end of the electrode wire 34 is grounded to the vehicle body 3.

With reference to FIGS. 6A and 7, each support portion 41 is formed integrally with the hollow insulating body 32 of the associated foreign object detection sensor 31 using the same material as the material of the hollow insulating body 32. Specifically, the support portion 41 is formed by an elastically deformable insulating body that has an insulating property and a shape restoring property. The insulating body may be soft plastic or rubber including elastomer. The support portion 41 projects outward in a radial direction of the hollow insulating body 32 from the outer peripheral surface 32a of the hollow insulating body 32. The support portion 41 extends continuously from one longitudinal end to the other in the hollow insulating body 32. The hollow insulating body 32 has a uniform cross section in the longitudinal direction of the hollow insulating body 32. Each support portion 41 is configured by an insertion portion 42 and a pair of pressing portions 43 each serving as a restricting portion, which are formed integrally with the insertion portion 42.

The insertion portion 42 is configured by a fitting portion 42a, a first insertion portion 42b, and a second insertion portion 42c. The fitting portion 42a projects outward in the radial direction of the hollow insulating body 32 from the outer peripheral surface 32a of the hollow insulating body 32. The first insertion portion 42b extends outward in the radial direction of the hollow insulating body 32 from the distal end of the fitting portion 42a. The second insertion portion 42c extends outward in the radial direction of the hollow insulating body 32 from the distal end of the first insertion portion 42b.

The fitting portion 42a extends continuously from one end to the other of the hollow insulating body 32 in the longitudinal (axial) direction of the hollow insulating body 32. Referring to FIG. 5A, the height of the fitting portion 42a is smaller than the length of the through hole 26 in the extending direction of the through hole 26. The width of the fitting portion 42a is equal to the width of the through hole 26. Specifically, the height of the fitting portion 42a refers to the length of the fitting portion 42a in the radial direction of the hollow insulating body 32. The width of the fitting portion 42a refers to the length of the fitting portion 42a in a circumferential direction of the hollow insulating body 32.

The first insertion portion 42b is formed at the distal end of the fitting portion 42a and extends continuously from one longitudinal end to the other of the fitting portion 42a, or, in other words, from one longitudinal end to the other of the hollow insulating body 32. The width of the first insertion portion 42b is smaller than the width of the through hole 26. Specifically, the width of the first insertion portion 42b refers to the length of the first insertion portion 42b in the circumferential direction of the hollow insulating body 32.

The second insertion portion 42c is formed at the distal end of the first insertion portion 42b and extends continuously from one longitudinal end to the other of the first insertion portion 42b, or, in other words, from one longitudinal end to the other of the hollow insulating body 32. In other words, the second insertion portion 42c is formed in a distal portion of the support portion 41 adjacently to the first insertion portion 42b in the projecting direction of the insertion portion 42. The width of the second insertion portion 42c is smaller than the width of the through hole 26 and greater than the width of the first insertion portion 42b. Specifically, the width of the second insertion portion 42c refers to the length of the second insertion portion 42c in the circumferential direction of the hollow insulating body 32. That is, the width of the second insertion portion 42c is smaller than the width of the through hole 26.

As illustrated in FIG. 6A, the two pressing portions 43 are arranged at the opposite sides of the insertion portion 42 in the width direction of the insertion portion 42. The pressing portions 43 each extend from the boundary between the first insertion portion 42b and the second insertion portion 42c in the corresponding side surface of the insertion portion 42 in the width direction, projecting toward the foreign object detection sensor 31. Each of the pressing portions 43 extends continuously from one longitudinal end to the other of the insertion portion 42, or, in other words, from one longitudinal end to the other of the hollow insulating body 32. Each pressing portion 43 projects in such a manner as to separate from the distal surface of the second insertion portion 42c in a direction extending from the proximal end to the distal end of the pressing portion 43. The distal ends of the pressing portions 43 face the proximal end of the insertion portion 42. From the proximal end toward the distal end, each pressing portion 43 is separated away from a middle portion of the insertion portion 42 in the width direction. A columnar contact portion 43a, which extends in the longitudinal direction of the insertion portion 42, is formed at the distal end of each pressing portion 43. The diameter of each contact portion 43a is slightly greater than the width of the portion of each pressing portion 43 located proximal with respect to the contact portion 43a.

With reference to FIG. 6B, the width of the first insertion portion 42b and the width of each pressing portion 43 are each set to such a value that, when the pressing portions 43 project toward the foreign object detection sensor 31 and folded in a state pressed against the first insertion portion 42b, the pressing portions 43 and the first insertion portion 42b altogether can proceed through (and past) the through hole 26. As illustrated in FIG. 6C, the width of the second insertion portion 42c and the width of each pressing portion 43 are each set to such a value that, when the pressing portions 43 project toward the distal end of the insertion portion 42 and folded in a state pressed against the second insertion portion 42c, the pressing portions 43 and the second insertion portion 42c cannot proceed through (or past) the through hole 26 altogether.

Operation of the fixing structure for the foreign object detection sensor 31 of the first embodiment, together with a procedure for fixing the foreign object detection sensor 31 to the bracket 12, will hereafter be described.

With reference to FIG. 6B, to fix each foreign object detection sensor 31 to the corresponding bracket 12 using the support portion 41, the second insertion portion 42c of the support portion 41 is inserted into the through hole 26 from the outer opening 26b of the through hole 26. The support portion 41 is continuously sent into the through hole 26 until the support portion 41 is out from the through hole 26. Specifically, at this stage, as the insertion portion 42 proceeds in the through hole 26, the two pressing portions 43 are pressed against the inner wall surface of the through hole 26. In this state, the pressing portions 43 project toward the foreign object detection sensor 31 and are folded in a manner pressed against the first insertion portion 42b. The folded pressing portions 43 and the first insertion portion 42b elastically deform slightly and proceed through (and past) the through hole 26. Then, as illustrated in FIG. 5A, the pressing portions 43 restore their original shapes in the holding recess 23 and separate from the first insertion portion 42b. The contact portions 43a formed at the distal ends of the pressing portions 43 are thus pressed against and brought into contact with the corresponding pressing surfaces 25, which are arranged at the opposite sides of the through hole 26 in the width direction. Further, the fitting portion 42a becomes fitted in the through hole 26 and the outer peripheral surface 32a of the hollow insulating body 32 contacts the receiving surfaces 27a, 27b at the opposite sides of the fitting portion 42a in the width direction. As a result, the pressing portions 43 pressing the pressing surfaces 25 and the hollow insulating body 32 of the foreign object detection sensor 31 clamp the portion of the holding portion 22 between the receiving surfaces 27a, 27b and the pressing surfaces 25 from the opposite sides of the extending direction of the through hole 26. This fixes the foreign object detection sensor 31 to the bracket 12 through the support portion 41. In other words, the sensor line 13 is fixed to the bracket 12. As has been described, the two pressing portions 43, which press the pressing surfaces 25, and the hollow insulating body 32 of the foreign object detection sensor 31 hold the bracket 12 from the opposite sides of the through hole 26 in the extending direction of the through hole 26. The foreign object detection sensor 31 is thus stably fixed to the bracket 12.

When each foreign object detection sensor 31 is fixed to the corresponding bracket 12, a portion of the foreign object detection sensor 31 corresponding to an approximately 270 degree range opposite to the holding portion 22 (the receiving surfaces 27a, 27b) is exposed to the exterior. The exposed portion of the foreign object detection sensor 31 corresponds to a detection range, in which a foreign object X (see FIG. 8) is detectable when the foreign object X contacts the foreign object detection sensor 31. The detection range includes zones in each of which external force applied to the foreign object detection sensor 31 acts on the receiving surface 27a or the receiving surface 27b through the radial center of the foreign object detection sensor 31. In these zones, the receiving surface 27a or the receiving surface 27b receives the external force through the foreign object detection sensor 31. This presses the foreign object detection sensor 31 between the foreign object X and the receiving surface 27a or the receiving surface 27b, thus facilitating deformation of the foreign object detection sensor 31.

As illustrated in FIG. 2, the electric current detecting section 14 is arranged at one longitudinal end of the foreign object detection sensor 31, which is the right end as viewed in FIG. 2, or the end corresponding to the resistor 39. The electric current detecting section 14 supplies an electric current to the electrode wire 33. With reference to FIGS. 2 and 5A, in a normal state where the foreign object detection sensor 31 is free from external force such as pressing force, the electric current supplied from the electric current detecting section 14 to the electrode wire 33 proceeds in the electrode wire 35 and reaches the electrode wires 34, 36 via the resistor 39. In contrast, referring to FIGS. 2 and 8, when external force is applied to a portion of the foreign object detection sensor 31 to such an extent that the foreign object detection sensor 31 is deformed in a radial direction, the portion of the hollow insulating body 32 corresponding to the portion receiving the external force is elastically deformed. This deforms the electrode wires 33 to 36 and at least one of the electrode wires 33, 35 contacts at least one of the electrode wires 34, 36, thus causing a short circuit in the circuits formed by the affected electrode wires. As a result, the electric current supplied from the electric current detecting section 14 to the electrode wire 33 flows to the electrode wires 34, 36 without passing through the resistor 39. Accordingly, when an electric current is fed to the electrode wire 33 at a constant voltage, for example, the value of the electric current changes and such change is detected by the electric current detecting section 14. The electric current detecting section 14 thus detects the foreign object X, which has come into contact with the foreign object detection sensor 31. Specifically, when detecting a change in the electric current, or detecting the foreign object X that has come into contact with the foreign object detection sensor 31, the electric current detecting section 14 sends a foreign object detection signal to a door ECU 51, which will be described later. When the foreign object detection sensor 31 is released from the external force, the hollow insulating body 32 restores its original shape and the electrode wires 33 to 36 return to their original positions. Normal electric current supply is thus resumed.

With reference to FIGS. 1 and 2, the electric tail door apparatus 2 includes the door ECU 51, which is mounted in the interior of the door panel 5 and controls opening/closing operation of the door panel 5 by the actuator 6. The door ECU 51 has a ROM (Read Only Memory) and a RAM (Random Access Memory) and functions as a microcomputer. The door ECU 51 receives electric power supplied from a battery (not shown) installed in the vehicle 1. The door ECU 51 supplies an electric current to the electric current detecting section 14, which is electrically connected to the door ECU 51. The door ECU 51 controls the actuator 6 based on various types of signals provided by the manipulation switch 9, the position detector 8, and the electric current detecting section 14.

Operation of the electric tail door apparatus 2, which has the above-described configuration, will now be generally described with reference to FIGS. 1 and 2.

When the door ECU 51 receives an opening signal from the manipulation switch 9, the door ECU 51 operates the actuator 6 to open the door panel 5. The door ECU 51 determines the rotational position of the door panel 5 using a position detection signal provided by the position detector 8. In the first embodiment, the door ECU 51 counts the number of the position detection signals and determines the rotational position of the door panel 5 based on the count, which is a pulse number. When the door panel 5 reaches the fully open position where the tail opening 4 becomes maximally open, the door ECU 51 stops the actuator 6.

In contrast, in response to a closing signal from the manipulation switch 9, the door ECU 51 actuates the actuator 6 to close the door panel 5. When the door panel 5 reaches the fully closed position, at which the tail opening 4 is fully closed, the door ECU 51 stops the actuator 6. If a foreign object X contacts the foreign object detection sensor 31 and applies external force to the foreign object detection sensor 31 when the door panel 5 is in closing operation, the hollow insulating body 32 of the foreign object detection sensor 31 elastically deforms to cause contact between at least one of the electrode wires 33, 35 and at least one of the electrode wires 34, 36. This causes a short circuit in the circuits formed by the electrode wires. As a result, the value of the electric current supplied to the electrode wire 33 changes and causes the electric current detecting section 14 to output a foreign object detection signal to the door ECU 51. When the foreign object detection signal is input to the door ECU 51, the door ECU 51 reverses the rotating direction of the actuator 6 and opens the door panel 5 by a predetermined amount before stopping the actuator 6.

The first embodiment has the advantages described below.

(1) Each foreign object detection sensor 31 and the pressing portions 43 of the associated support portion 41, which passed through the through hole 26, clamp the bracket 12 from the opposite sides of the extending direction of the through hole 26. This stably fixes the foreign object detection sensor 31 to the bracket 12, which is formed by plastic to reduce its weight. As a result, the foreign object detection sensor 31 elastically deforms with improved responsiveness when receiving external force applied by a foreign object X.

(2) Each bracket 12 includes the receiving surfaces 27a, 27b, which contact the outer peripheral surface of the foreign object detection sensor 31, or, in other words, the outer peripheral surface 32a of the hollow insulating body 32, and receive external force through the foreign object detection sensor 31. The receiving surfaces 27a, 27b stabilize the posture of the foreign object detection sensor 31, thus improving stability in fixation of the foreign object detection sensor 31 to the plastic bracket 12. If a foreign object X applies external force to the foreign object detection sensor 31, the receiving surfaces 27a, 27b also receive the external force through the foreign object detection sensor 31. In this case, since the foreign object detection sensor 31 is supported by the receiving surfaces 27a, 27b, the foreign object detection sensor 31 is prevented from displacing with respect to the bracket 12. The foreign object detection sensor 31 is thus allowed to elastically deform while maintained at the position where the foreign object detection sensor 31 is stably fixed to the bracket 12. Also, since the foreign object detection sensor 31 is clamped between the foreign object X and the receiving surfaces 27a, 27b, the foreign object detection sensor 31 is easily deformed elastically by the external force applied by the foreign object X. This enhances detection sensitivity of the foreign object detection sensor 31 for the foreign object X.

(3) The receiving surfaces 27a, 27b, each of which has the arcuate shape having the radius of curvature equal to the radius of curvature of the cylindrical outer peripheral surface of the foreign object detection sensor 31, or, in other words, the outer peripheral surface 32a of the hollow insulating body 32, contact the outer peripheral surface of the foreign object detection sensor 31. This further stably fixes the foreign object detection sensor 31 to the bracket 12. The foreign object detection sensor 31 is thus further effectively prevented from being displaced with respect to the bracket 12 by receiving external force from a foreign object X. Also, the strength of the bracket 12 in the vicinity of the through hole 26 is ensured without increasing the thickness of the bracket 12.

(4) Each support portion 41 is formed integrally with the hollow insulating body 32 using the same material as the material of the hollow insulating body. This reduces the number of the components, thus saving manufacture costs and facilitating parts control. Since the hollow insulating body 32 and the support portion 41 are formed together, productivity is improved.

(5) The second insertion portion 42c is formed in the distal portion of each support portion 41. The width of the second insertion portion 42c is smaller than the width of the through hole 26. When each foreign object detection sensor 31 is fixed to the corresponding bracket 12, the second insertion portion 42c of the support portion 41 is first inserted into the through hole 26. This facilitates insertion of the support portion 41 through the through hole 26. The foreign object detection sensor 31 is thus easily fixed to the bracket 12. In the first embodiment, to fix the foreign object detection sensor 31 to the bracket 12, the second insertion portion 42c is inserted into the through hole 26 and then pulled from the opening 23a of the holding recess 23. The support portion 41 is thus passed through the through hole 26. In this manner, the foreign object detection sensor 31 is fixed to the bracket 12 without applying great pressing force to the foreign object detection sensor 31.

(6) The first insertion portion 42b and the pressing portions 43 can be passed through the through hole 26 altogether. In contrast, the second insertion portion 42c and the pressing portions 43 cannot be inserted through the through hole 26 altogether. Accordingly, to fix each foreign object detection sensor 31 to the corresponding bracket 12, the first insertion portion 42b and the pressing portions 43 are inserted into the through hole 26 altogether such that the support portion 41 is passed through the through hole 26. When external force acts on the foreign object detection sensor 31 fixed to the bracket 12 in a direction in which the foreign object detection sensor 31 separates from the bracket 12, the pressing portions 43 are folded toward the second insertion portion 42c. In this state, the second insertion portion 42c and the pressing portions 43 prevent the support portion 41 from separating from the through hole 26, thus preventing disengagement of the foreign object detection sensor 31 from the bracket 12.

(7) Each foreign object detection sensor 31 is stably fixed to the corresponding bracket 12, which is formed of plastic to reduce its weight. This facilitates elastic deformation of the foreign object detection sensor 31 when the foreign object detection sensor 31 receives external force from a foreign object X. This maintains detection sensitivity for the foreign object X.

(8) The foreign object detection sensors 31 are stably fixed to the door panel 5, which selectively opens and closes the tail opening 4 formed in the tail portion of the vehicle 1, at the peripheral portions of the door panel 5 facing the corresponding peripheral portions of the tail opening 4.

(9) Each support portion 41 extends continuously from one longitudinal end to the other of the foreign object detection sensor 31, or, in other words, one longitudinal end to the other of the hollow insulating body 32, in the longitudinal direction of the foreign object detection sensor 31. As a result, at any longitudinal position on the elongated foreign object detection sensor 31, the support portion 41 and the foreign object detection sensor 31 clamp the bracket 12 from the opposite sides of the extending direction of the through hole 26. The foreign object detection sensor 31 is thus fixed to the bracket 12 with increased stability. Also, the support portion 41 is molded easily through extrusion.

(10) When the support portion 41 is passed through the through hole 26, the fitting portion 42a is fitted in the through hole 26. This prevents rattling of the foreign object detection sensor 31.

A second embodiment of the present invention will hereafter be described with reference to the attached drawings.

Figure 9:
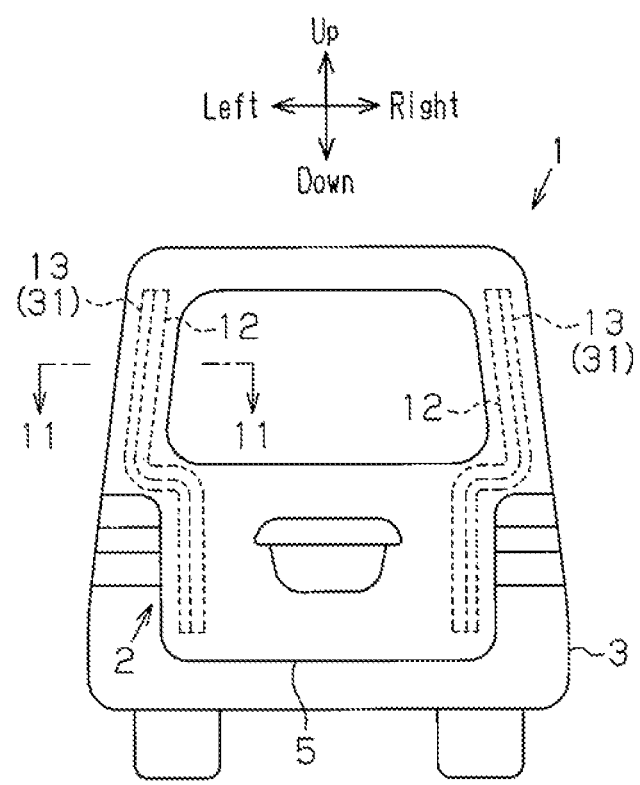
FIG. 9 is a diagram schematically showing a vehicle having an electric tail door apparatus.

FIG. 9 shows the vehicle 1 in a state where the tail opening 4 is closed by the door panel 5. With reference to FIG. 11, each attachment surface 5a of the door panel 5 has an attachment portion 5b, which is shaped as a plane perpendicular to the movement direction (the direction indicated by arrow α in FIG. 11) of the door panel 5 immediately before the door panel 5 reaches its fully closed position when the door panel 5 is in closing operation. The sensor line 13 is arranged above the attachment portion 5b.

Each holding-side contact surface 12b contacts the attachment portion 5b of the corresponding attachment surface 5a. Each bracket 12 is attached to the door panel 5 using a plurality of pins 28 extending through the fixing portion 21.

Figure 10:
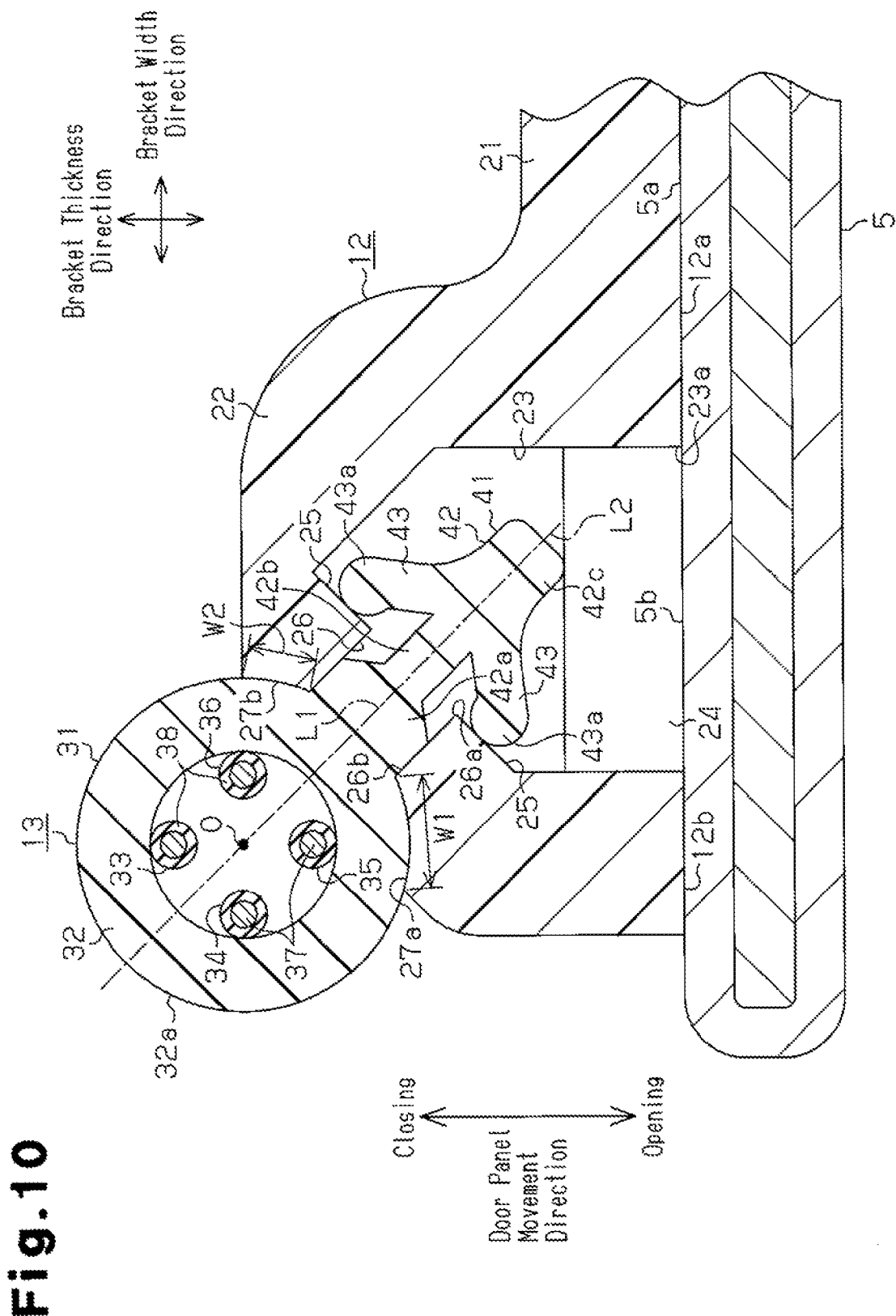
FIG. 10 is a cross-sectional view showing the bracket and the sensor line illustrated in FIG. 9 as viewed perpendicularly to the longitudinal directions of the bracket and the sensor line.

The support portion 41 is inserted into the through hole 26, which is inclined with respect to the holding-side contact surface 12b contacting the attachment portion 5b of the attachment surface 5a. The support portion 41 is thus received in the bracket 12 in a manner inclined with respect to the attachment portion 5b of the attachment surface 5a. Specifically, as viewed in a cross section perpendicular to the longitudinal direction of the foreign object detection sensor 31, the support portion 41 is inclined such that the axis L2 of the support portion 41 becomes separated away from the attachment portion 5b in a direction extending from the distal end toward the proximal end of the support portion 41. Referring to FIG. 10, the axis L2 is a line that extends on the center of the insertion portion 42 in the width direction and projects in the direction in which the support portion 41 projects from the outer peripheral surface 32a. Further, the support portion 41 is inclined such that the proximal end of the support portion 41 is located close to the outer periphery of the door panel 5 compared to the distal end of the support portion 41. As a result, the support portion 41 is inclined with respect to the attachment portion 5b such that the foreign object detection sensor 31 is located close to the outer peripheral end of the door panel 5. In other words, as viewed in a cross section perpendicular to the longitudinal direction of the foreign object detection sensor 31, the support portion 41 is inclined in the movement direction of the door panel 5 in the closing operation such that the foreign object detection sensor 31 is arranged close to the outer peripheral end of the door panel 5.

When the support portion 41 is inserted through the through hole 26 and thus the foreign object detection sensor 31 is fixed to the bracket 12, the two receiving surfaces 27a, 27b are located at the opposite sides of the support portion 41 in a circumferential direction of the foreign object detection sensor 31. The receiving surfaces 27a, 27b include a first receiving surface 27a closer to the attachment portion 5b and a second receiving surface 27b farther from the attachment portion 5b. The dimension of the first receiving surface 27a in the circumferential direction of the foreign object detection sensor 31 is greater than the corresponding dimension of the second receiving surface 27b. In other words, the circumferential width W1 of the first receiving surface 27a is greater than the circumferential width W2 of the second receiving surface 27b.

Operation of the fixing structure for the foreign object detection sensor 31 according to the second embodiment will hereafter be described.

Each foreign object detection sensor 31 is fixed to the corresponding bracket 12 by inserting the support portion 41 into the through hole 26 in a manner inclined with respect to the attachment portion 5b of the attachment surface 5a as viewed in a cross section perpendicular to the longitudinal direction of the foreign object detection sensor 31. As a result, the foreign object detection sensor 31 is arranged at a position close to the attachment portion 5b.

The second embodiment has the advantages described below, in addition to the advantage (3) of the first embodiment.

(1) Each support portion 41 is inserted into the corresponding bracket 12, which is formed of plastic to reduce its weight, in a manner inclined with respect to the attachment portion 5b of the attachment surface 5a as viewed in a cross section perpendicular to the longitudinal direction of the foreign object detection sensor 31. As a result, the foreign object detection sensor 31 is arranged at a position close to the attachment portion 5b compared to, for example, a case in which the support portion 41 is inserted into the bracket 12 in an upright state with respect to the attachment portion 5b. This reduces the height of the foreign object detection sensor 31 from the attachment portion 5b, which is the projecting amount of the foreign object detection sensor 31 from the attachment portion 5b.

(2) The first receiving surface 27a, which is close to the attachment portion 5b of the attachment surface 5a, has a shape extending substantially parallel to the attachment portion 5b, compared to the second receiving surface 27b, which is farther from the attachment portion 5b. The dimension of the first receiving surface 27a in the circumferential direction of the foreign object detection sensor 31 is greater than the corresponding dimension of the second receiving surface 27b. In other words, the width W1 of the first receiving surface 27a in the circumferential direction of the foreign object detection sensor 31 is greater than the width W2 of the second receiving surface 27b in the circumferential direction of the foreign object detection sensor 31. As a result, even when force acting in a direction substantially perpendicular to the attachment portion 5b, which is force acting in a direction substantially parallel to the movement direction of the door panel 5, is applied from a foreign object X to the foreign object detection sensor 31 from the side opposite to the first receiving surface 27a, the first receiving surface 27a stably supports the foreign object detection sensor 31. This elastically deforms the foreign object detection sensor 31 effectively between the first receiving surface 27a and the foreign object X.

If, for example, the circumferential width W2 of the second receiving surface 27b is equal to the circumferential width W1 of the first receiving surface 27a, the height of the holding portion 22, which is the height of the holding portion 22 from the attachment portion 5b, may excessively increase. Accordingly, by increasing the dimension of the first receiving surface 27a in the circumferential direction of the foreign object detection sensor 31 compared to the dimension of the second receiving surface 27b, the foreign object detection sensor 31 is supported without increasing the height of the holding portion 22. The weight of each bracket 12 is also prevented from increasing.

(3) The foreign object detection sensors 31 are arranged in the peripheral portions of the door panel 5 facing the corresponding peripheral portions of the tail opening 4, without increasing the height of each foreign object detection sensor 31 from the attachment portion 5b of the attachment surface 5a. The position for arranging each foreign object detection sensor 31 in the door panel 5 is thus not restricted by the shape of the corresponding peripheral portion of the tail opening 4 in the vehicle body 3.

(4) The height of each foreign object detection sensor 31 from the attachment portion 5b of the attachment surface 5a is reduced, thus improving flexibility for arranging each foreign object detection sensor 31 in the foreign object detection apparatus 11.

(5) To reduce the height of each foreign object detection sensor 31 from the attachment portion 5b, the support portion 41 may be formed shorter in the direction in which the support portion 41 projects from the outer peripheral surface of the foreign object detection sensor 31. In this case, the support portion 41 is inserted into the bracket 12 in a state upright with respect to the attachment portion 5b. However, in this case, the shorter support portion 41, which fixes the foreign object detection sensor 31 to the bracket 12, may make it difficult to stably fix the foreign object detection sensor 31 to the bracket 12. In contrast, in the second embodiment, the height of each foreign object detection sensor 31 from the attachment portion 5b is reduced by inclining the support portion 41 with respect to the attachment portion 5b of the attachment surface 5a, as viewed in a cross section perpendicular to the longitudinal direction of the foreign object detection sensor 31, when inserting the support portion 41 into the bracket 12. This makes it unnecessary to form the support portion 41 shorter, thus allowing stable fixation of the foreign object detection sensor 31 to the bracket 12.

(6) As viewed in a cross section perpendicular to the longitudinal direction of the foreign object detection sensor 31, each support portion 41 is inclined such that the foreign object detection sensor 31 is arranged close to the corresponding outer peripheral end of the door panel 5. This makes it easy for a foreign object X between a peripheral portion of the tail opening 4 and an opposed peripheral portion of the door panel 5 to contact the foreign object detection sensor 31.

The illustrated embodiments may be modified to the forms described below.

In the first embodiment, each foreign object detection apparatus 11 is employed in the electric tail door apparatus 2, which electrically opens and closes the door panel 5 to selectively open and close the tail opening 4 formed in the tail portion of the vehicle 1. However, the foreign object detection apparatus 11 may be mounted in an electric door opening/closing apparatus for electrically opening and closing an opening/closing body, which selectively opens and closes an opening formed in the vehicle, in addition to or instead of the electric tail door apparatus 2. For example, the foreign object detection apparatus 11 may be used in an electric sliding door apparatus for electrically sliding a door panel (an opening/closing body) to selectively open and close an opening (an entrance) formed in a side portion of the vehicle 1. Alternatively, the foreign object detection apparatus 11 may be mounted in a sun roof apparatus for electrically opening and closing a roof panel (an opening/closing body) to selectively open and close an opening formed in the top surface of the vehicle 1. In any of these cases, each plastic bracket 12 must be attached to a peripheral portion of an opening formed in the vehicle 1 or an opposed peripheral portion of an opening/closing body for selectively opening and closing the opening. Also in these cases, the weight of the vehicle 1 is reduced and the foreign object detection sensor 31 is stably fixed to the peripheral portion of the opening in the vehicle 1 or the opposed peripheral portion of the opening/closing body.

In the first and second embodiments, the brackets 12 are attached to the peripheral portions of the door panel 5 opposed to the peripheral portions of the tail opening 4. However, the brackets 12 may be attached to peripheral portions of the tail opening 4 opposed to corresponding peripheral portions of the door panel 5.

In the first and second embodiments, the electric current detecting section 14 feeds electric current to the electrode wire 33 at a constant voltage. The electric current detecting section 14 outputs a foreign object detection signal when detecting a change in the electric current caused by contact between any ones of the electrode wires 33 to 36. However, the electric current detecting section 14 may output a foreign object detection signal when detecting a change in the voltage caused by contact between any ones of the electrode wires 33 to 36.

Figures 12A, 12B:
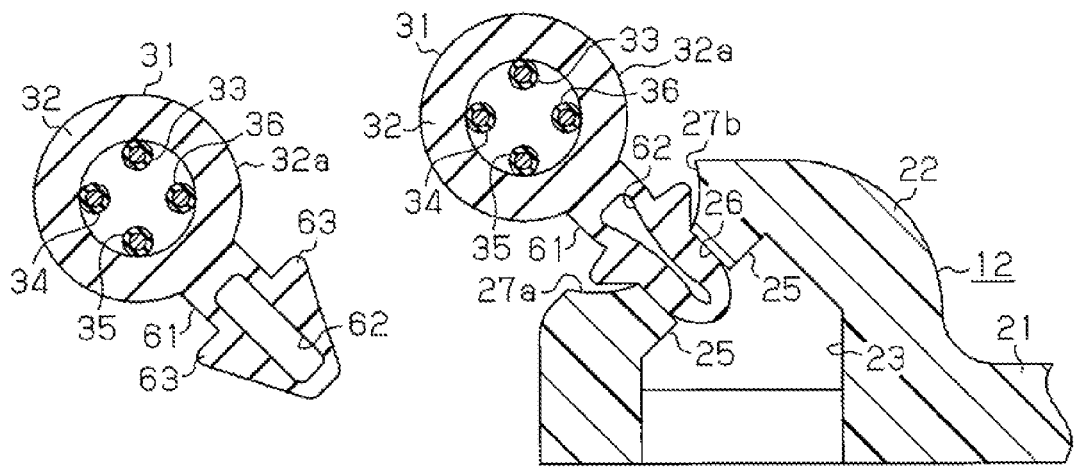
FIG. 12A is a cross-sectional view showing the foreign object detection sensor and a support portion of another embodiment.
FIG. 12B is a cross-sectional view showing the foreign object detection sensor, the support portion illustrated in FIG. 12A, and a bracket.
Figure 13:
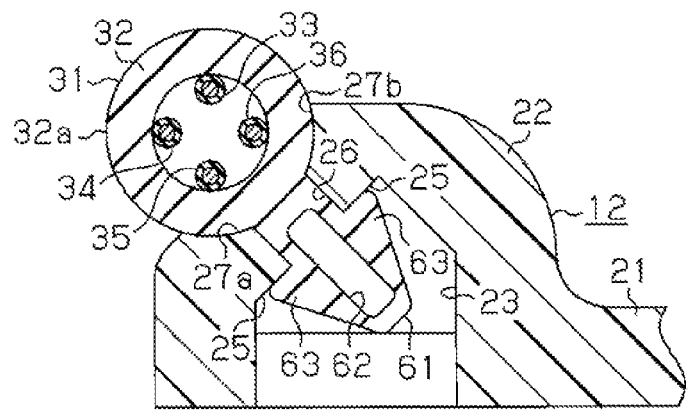
FIG. 13 is a cross-sectional view showing the foreign object detection sensor and the support portion and the bracket illustrated in FIG. 12B.

Each support portion 41 of the first embodiment may be replaced by a support portion 61 illustrated in FIG. 12A, which is arranged on the outer peripheral surface of each foreign object detection sensor 31. The support portion 61 is formed integrally with the hollow insulating body 32 and extends continuously in the longitudinal direction of the foreign object detection sensor 31. The support portion 61 has a uniform cross section as viewed in a direction perpendicular to the longitudinal direction of the support portion 61. A hollow portion 62 is formed in the support portion 61. The hollow portion 62 extends from a position immediately close to the proximal end of the support portion 61 to a position immediately close to the distal end of the support portion 61, thus covering substantially an entire range in the projecting direction of the support portion 61. The support portion 61 has a pair of pressing portions 63, which project to the opposite sides of the support portion 61 in the width direction. As illustrated in FIG. 13, each of the pressing portions 63 contacts the corresponding one of the pressing surfaces 25 when the support portion 61 is passed through the through hole 26. In this state, the pressing portions 63, together with the foreign object detection sensor 31, clamp the bracket 12 from the opposite sides of the extending direction of the through hole 26. In this configuration, referring to FIG. 12B, the support portion 61 easily deforms elastically by reducing the width of the hollow portion 62 when passing through the through hole 26. In other words, the hollow portion 62 in the support portion 61 facilitates elastic deformation of the support portion 61. The support portion 61 is thus allowed to proceed through the through hole 26 smoothly. This further facilitates fixation of the foreign object detection sensor 31 to the bracket 12. Also, the weight of the support portion 61 is reduced. Further, the hollow portion 62 allows the support portion 61 to easily flex in the longitudinal direction. As a result, the foreign object detection sensor 31 is easily fixed along the corresponding peripheral portion of the door panel 5 even when the peripheral portion of the door panel 5 has a non-linear shape.

Figure 14:
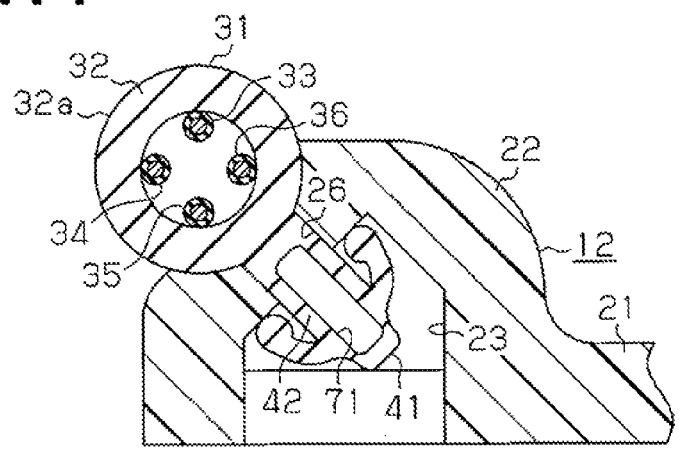
FIG. 14 is a cross-sectional view showing the foreign object detection sensor, a support portion of another embodiment, and the bracket.

With reference to FIG. 14, a hollow portion 71 may be formed in the insertion portion 42 of each support portion 41 of the first embodiment. Also in this case, the same advantages as the advantages of the form illustrated in FIG. 12A are obtained.

Figure 15A:
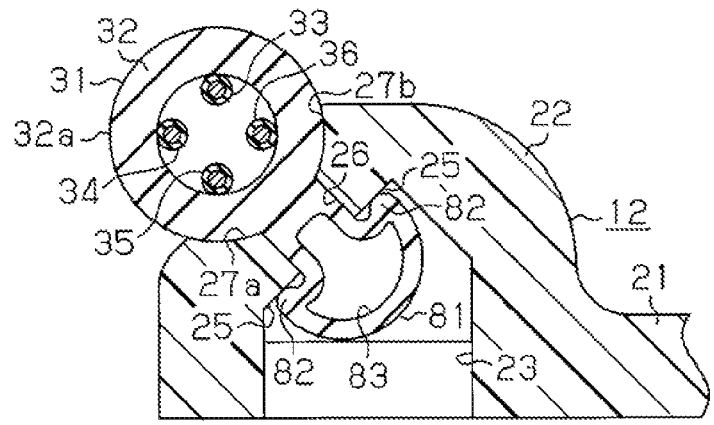
FIGS. 15A and 15B are cross-sectional views each showing the foreign object detection sensor, a support portion of another embodiment, and the bracket.
Figure 15B:
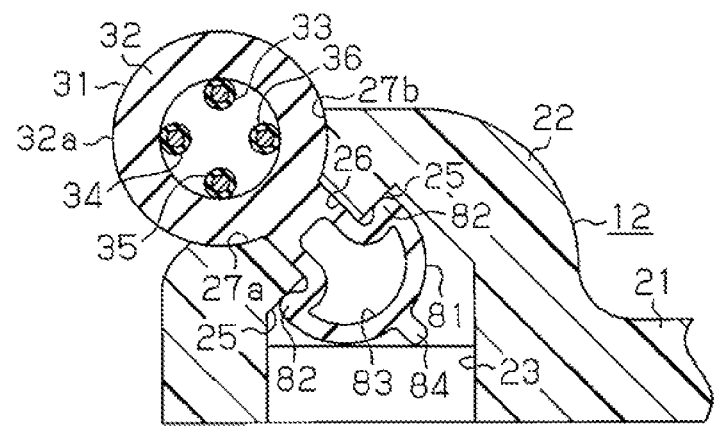

As illustrated in FIG. 15A, a support portion 81 may include a hollow portion 83, which extends into pressing portions 82 projected toward the opposite sides in the width direction. This configuration brings about the same advantages as the advantages of the form illustrated in FIG. 12A. With reference to FIG. 15B, an introducing portion 84, which has a width smaller than the width of the through hole 26, may be formed at the distal end of the support portion 81. This ensures the same advantage as the advantage (5) of the first embodiment.

Figure 16:
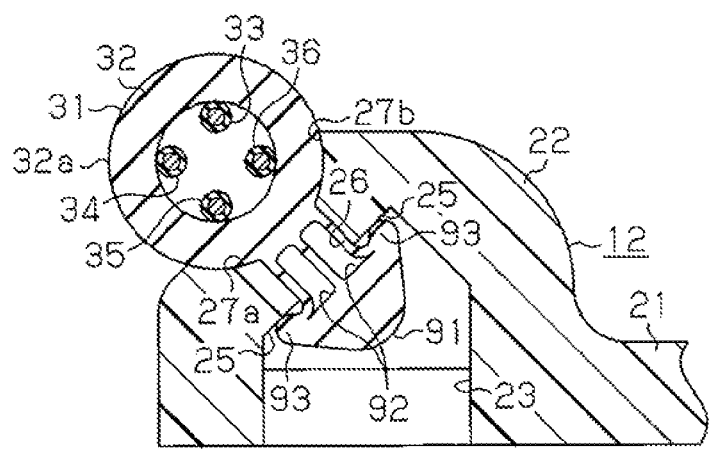
FIG. 16 is a cross-sectional view showing the foreign object detection sensor, a support portion of another embodiment, and the bracket.

As illustrated in FIG. 16, a support portion 91 may have hollow portions 92, which are formed only in a proximal portion of the support portion 91. The support portion 91 includes a pair of pressing portions 93, which project toward the opposite sides of the support portion 91 in the width direction to press the corresponding pressing surfaces 25. In the support portion 91, each of the hollow portions 92 extends from a position in the vicinity of the distal end of the corresponding one of the pressing portions 93, which is the portion contacting the pressing surface 25, to a position in the proximity of the proximal end of the support portion 91. This configuration brings about the same advantages as the advantages of the form illustrated in FIG. 12A.

Figure 17:
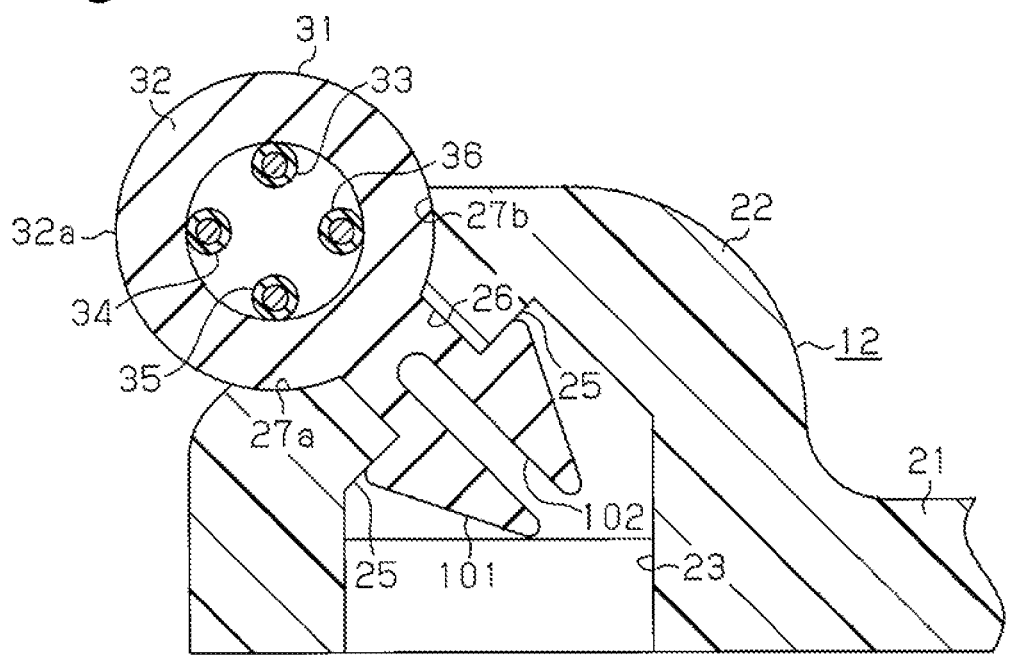
FIG. 17 is a cross-sectional view showing the foreign object detection sensor, a support portion of another embodiment, and the bracket.

As illustrated in FIG. 17, a support portion 101 may have a hollow portion 102, which has an opening at the distal end of the support portion 101. This configuration ensures the same advantages as the advantages of the configuration illustrated in FIG. 12A.

The hollow portions 62, 71, 83, 92, 102 do not necessarily have to extend continuously in the longitudinal direction of the foreign object detection sensor 31 but may be formed in a portion of the support portions 61, 41, 81, 91, 101.

In the first embodiment, each pressing portion 43 extends from the boundary between the first insertion portion 42b and the second insertion portion 42c on the corresponding side surface of the insertion portion 42 in the width direction and projects toward the foreign object detection sensor 31. However, the pressing portions 43 may extend from the opposite side surfaces of the first insertion portion 42b in the width direction and project toward the foreign object detection sensor 31. Further, the support portion 41 does not necessarily have to include the two pressing portions 43. Also, although the second insertion portion 42c and the pressing portions 43 cannot proceed through the through hole 26 altogether in the first embodiment, the second insertion portion 42c may be configured to move through the through hole 26 together with the pressing portions 43.

Each support portion 41 of the first embodiment does not necessarily have to have the second insertion portion 42c (an introducing portion).

Figure 18:
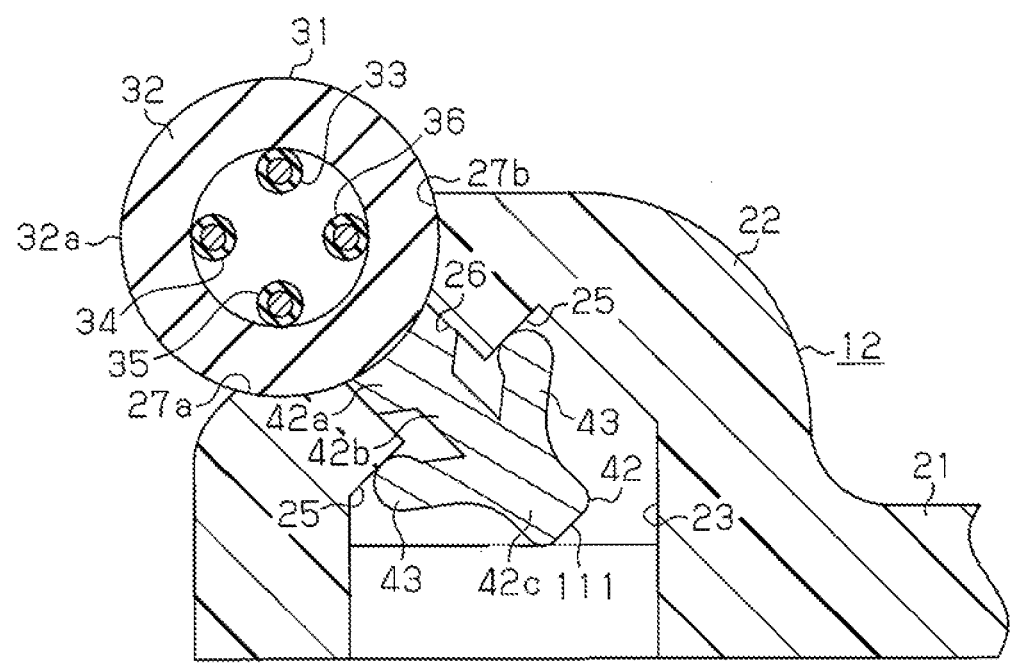
FIG. 18 is a cross-sectional view showing the foreign object detection sensor, a support portion of another embodiment, and the bracket.

In the first and second embodiments, each support portion 41 is formed of the same material as the material of the hollow insulating body 32. However, with reference to FIG. 18, a support portion 111, which is formed of material harder than the material of the hollow insulating body 32, such as plastic or elastically deformable metal, may be fixed to each hollow insulating body 32. This prevents the foreign object detection sensor 31 from becoming unstable with respect to the bracket 12. The term "the support portion 111 fixed to the hollow insulating body 32" includes the support portion 111 molded integrally with the hollow insulating body 32.

In the first and second embodiments, each foreign object detection sensor 31 includes four electrode wires 33 to 36. However, the foreign object detection sensor 31 may have any suitable number of electrode wires, such as six wires, as long as the foreign object detection sensor 31 includes at least two electrode wires.

In the first and second embodiments, each electrode wire 33 to 36 may be a single wire formed of annealed copper.

In the first and second embodiments, each foreign object detection sensor 31 has the cylindrical hollow insulating body 32, which forms the cylindrical outer peripheral surface of the foreign object detection sensor 31. However, the outer peripheral surface of the foreign object detection sensor 31 is not restricted to the cylindrical shape but may be a polygonal or oval tubular shape. In these cases, it is desirable to shape the receiving surfaces 27a, 27b, which contact the outer peripheral surface of the foreign object detection sensor 31, in correspondence with the shape of the outer peripheral surface of the foreign object detection sensor 31.

As long as each bracket 12 is clamped by the foreign object detection sensor 31 and the support portion 41 passed through the through hole 26 from the opposite sides of the extending direction of the through hole 26, the shapes of the foreign object detection sensors 31, the support portions 41, and the brackets 12 are not restricted to the shapes of the first embodiment. For example, each bracket 12 may be formed without a receiving surface 27a, 27b.

Although each support portion 41 of the first and second embodiments is formed continuously in the longitudinal direction of the foreign object detection sensor 31, the support portion 41 may be arranged at a plurality of positions in the longitudinal direction of the foreign object detection sensor 31. In this case, each through hole 26 is not restricted to the slit-like shape of the illustrated embodiments but may be formed at a plurality of positions in the longitudinal direction of the bracket 12.

In the first and second embodiments, each foreign object detection sensor 31 may include an elastically deformable tubular protection member for covering the outer periphery of the hollow insulating body 32. In this case, each support portion 41 projects from the outer peripheral surface of the protection member.

In the first and second embodiments, each foreign object detection sensor 31 may detect not only a foreign object X through elastic deformation when the foreign object X has come into contact with the foreign object detection sensor 31, but also capacitance between the foreign object detection sensor 31 and a foreign object X when the foreign object X approaches the foreign object detection sensor 31. In this case, the foreign object detection apparatus 11 detects the foreign object X approaching the foreign object detection sensor 31 based on the capacitance, which is provided by the foreign object detection sensor 31.

In the second embodiment, the width of the first receiving surface 27a in the circumferential direction of the foreign object detection sensor 31 is greater than the corresponding dimension of the second receiving surface 27b. However, the width of the first receiving surface 27a in the circumferential direction of the foreign object detection sensor 31 may be equal to the corresponding dimension of the second receiving surface 27b. Alternatively, the width of the first receiving surface 27a in the circumferential direction of the foreign object detection sensor 31 may be smaller than the corresponding dimension of the second receiving surface 27b. In the second embodiment, the radius of curvature of each of the receiving surfaces 27a, 27b is equal to the radius of curvature of the outer peripheral surface of the foreign object detection sensor 31 (the outer peripheral surface 32a of the hollow insulating body 32). However, the radius of curvature of each receiving surface 27a, 27b may be smaller than the radius of curvature of the outer peripheral surface of each foreign object detection sensor 31. Further, each bracket 12 does not necessarily have to have the receiving surfaces 27a, 27b.

In the second embodiment, by inserting each support portion 41 into the through hole 26, the support portion 41 is inclined with respect to the attachment portion 5b of the attachment surface 5a and the foreign object detection sensor 31 is fixed to the bracket 12. However, the support portion 41 and the insertion portion (in the second embodiment, the through hole 26) in the bracket 12 through which the support portion 41 is inserted are not restricted to the shapes of the second embodiment. The support portion 41 and the insertion portion may be shaped in any suitable manner as long as the foreign object detection sensor 31 is fixed to the bracket 12 by inserting the support portion 41 into the insertion portion such that the support portion 41 becomes inclined with respect to the attachment portion 5b of the attachment surface 5a, as viewed in a cross section perpendicular to the longitudinal direction of the foreign object detection sensor 31. For example, each bracket 12 may have a dented insertion portion extending in the longitudinal direction of the bracket 12. Specifically, the dented insertion portion is dented in a direction inclined with respect to the attachment portion 5b such that the support portion 41 becomes inclined with respect to the attachment portion 5b when inserted in the insertion portion. The support portion 41 may not include the pressing portions 43 and may be pressed into the dented insertion portion.

What is claimed is:

1. A structure for fixing a foreign object detection sensor to a plastic bracket, wherein the foreign object detection sensor is adapted for detecting a foreign object by being elastically deformed by external force applied by the foreign object, wherein
    a support portion projects from an outer peripheral surface of the foreign object detection sensor,
    the bracket has a penetration portion, through which the support portion is passed,
    the foreign object detection sensor and the support portion inserted through the penetration portion clamp the bracket from opposite sides of an extending direction of the penetration portion,
    the foreign object detection sensor has a cylindrical outer peripheral surface defining a radius of curvature, and
    the bracket has a curved receiving surface defining a radius of curvature, the curved receiving surface contacting the cylindrical outer peripheral surface of the foreign object detection sensor to receive the external force through the foreign object detection sensor, and
    the radius of curvature of the curved receiving surface is equal to the radius of curvature of the cylindrical outer peripheral surface of the foreign object detection sensor.

2. The structure for fixing a foreign object detection sensor according to claim 1, wherein
    the foreign object detection sensor includes an elastically deformable elongated hollow insulating body and a plurality of electrode wires, the electrode wires being spaced apart from each other and arranged at opposed positions in the hollow insulating body, the electrode wires being flexed through elastic deformation of the hollow insulating body to contact one another, and the support portion is formed of the same material as the material of the hollow insulating body and integrally with the hollow insulating body.

3. The structure for fixing a foreign object detection sensor according to claim 1, wherein
the foreign object detection sensor includes an elastically deformable elongated hollow insulating body and a plurality of electrode wires, the electrode wires being spaced apart from each other and arranged at opposed positions in the hollow insulating body, the electrode wires being flexed through elastic deformation of the hollow insulating body to contact one another, and
the support portion is formed of material harder than the material of the hollow insulating body, the support portion being fixed to the hollow insulating body.

4. The structure for fixing a foreign object detection sensor according to claim 1, wherein an introducing portion is formed at a distal end of the support portion, a width of the introducing portion being smaller than a width of the penetration portion.

5. The structure for fixing a foreign object detection sensor according to claim 1, wherein the support portion includes:
an insertion portion projecting from the outer peripheral surface of the foreign object detection sensor, the insertion portion including a first insertion portion and a second insertion portion, the second insertion portion being adjacent to the first insertion portion at a position closer to a distal end of the support portion compared to the first insertion portion; and
a restricting portion extending toward the foreign object detection sensor from a boundary between the first insertion portion and the second insertion portion or from a side surface of the first insertion portion and projecting, and
wherein the first insertion portion and the restricting portion are allowed to pass through the penetration portion together, but the second insertion portion and the restricting portion are inhibited from passing through the penetration portion together.

6. The structure for fixing a foreign object detection sensor according to claim 1, wherein a hollow portion is formed in the support portion.

7. The structure for fixing a foreign object detection sensor according to claim 1, wherein
the foreign object detection sensor has an elongated shape, and
the support portion extends continuously from one longitudinal end to the other of the foreign object detection sensor in the longitudinal direction of the foreign object detection sensor.

8. A foreign object detection apparatus comprising:
a foreign object detection sensor, which is elastically deformed by receiving external force;
a bracket; and
the structure for fixing a foreign object detection sensor according to claim 1, wherein
the foreign object detection sensor is fixed to the bracket through the support portion, and
the foreign object detection apparatus detects a foreign object that has come into contact with the foreign object detection sensor through elastic deformation of the foreign object detection sensor.

9. The foreign object detection apparatus according to claim 8, wherein the bracket is attached to an edge portion of an opening formed in a vehicle body or to a peripheral portion of an opening and closing body for selectively opening and closing the opening that is opposed to the edge portion of the opening.

10. The foreign object detection apparatus according to claim 9, wherein the opening and closing body is a tail door for selectively opening and closing the opening formed in a tail portion of the vehicle body.

11. A structure for fixing an elongated foreign object detection sensor to a plastic bracket attached to an attachment surface, the foreign object detection sensor being elastically deformed by external force applied by a foreign object to detect the foreign object, the attachment surface being provided on a peripheral portion of an opening formed in a vehicle body or on a peripheral portion of an opening and closing body for selectively opening and closing the opening that is opposed to an edge portion of the opening,
wherein the foreign object detection sensor is fixed to the bracket by inserting a support portion projecting from an outer peripheral surface of the foreign object detection sensor into the bracket such that the support portion becomes inclined with respect to the attachment surface as viewed in a cross section perpendicular to a longitudinal direction of the foreign object detection sensor,
the foreign object detection sensor has a cylindrical outer peripheral surface defining a radius of curvature,
the bracket includes first and second receiving surfaces at opposite sides of the support portion in a circumferential direction of the foreign object detection sensor, the receiving surfaces contacting the cylindrical outer peripheral surface of the foreign object detection sensor and receiving the external force through the foreign object detection sensor, a radius of curvature of each of the receiving surfaces being equal to the radius of curvature of the outer peripheral surface of the foreign object detection sensor, and in a circumferential direction of the foreign object detection sensor, a width of the first receiving surface, which is closer to the attachment surface, is greater than a width of the second receiving surface, which is farther from the attachment surface.

12. The structure for fixing an elongated foreign object detection sensor according to claim 11, wherein the opening is formed in a tail portion of the vehicle body, wherein the opening and closing body is a tail door, and wherein the bracket is attached to the attachment surface formed along a peripheral portion of the tail door that is opposed to the peripheral portion of the opening.

13. The structure for fixing an elongated foreign object detection sensor according to claim 12, wherein the support portion is inclined with respect to the attachment surface such that the foreign object detection sensor is located close to an outer peripheral end of the tail door as viewed in a cross section perpendicular to a longitudinal direction of the foreign object detection sensor.

14. A foreign object detection apparatus comprising:
a foreign object detection sensor elastically deformed by receiving external force;
a bracket; and
the structure according to claim 11, wherein
the foreign object detection sensor is fixed to the bracket through the support portion, and
the foreign object detecting apparatus detects a foreign object that has come into contact with the foreign object detection sensor through elastic deformation of the foreign object detection sensor.

* * * * *